(12) United States Patent
Diaz et al.

(10) Patent No.: US 9,680,012 B1
(45) Date of Patent: Jun. 13, 2017

(54) SEMICONDUCTOR DEVICE STRUCTURE AND METHOD FOR FORMING THE SAME

(71) Applicant: Taiwan Semiconductor Manufacturing Co., Ltd., Hsinchu (TW)

(72) Inventors: Carlos H. Diaz, Mountain View, CA (US); Jean-Pierre Colinge, Hsinchu (TW); Jonathan Tsung-Yung Chang, Hsinchu (TW); Yue-Der Chih, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/071,876

(22) Filed: Mar. 16, 2016

(51) Int. Cl.
| | |
|---|---|
| *H01L 29/732* | (2006.01) |
| *H01L 29/735* | (2006.01) |
| *H01L 29/80* | (2006.01) |
| *H01L 21/00* | (2006.01) |
| *H01L 21/338* | (2006.01) |
| *H01L 29/78* | (2006.01) |
| *H01L 29/06* | (2006.01) |
| *H01L 29/08* | (2006.01) |
| *H01L 29/10* | (2006.01) |
| *H01L 29/423* | (2006.01) |
| *H01L 27/088* | (2006.01) |
| *H01L 29/66* | (2006.01) |

(52) U.S. Cl.
CPC ........ *H01L 29/7827* (2013.01); *H01L 27/088* (2013.01); *H01L 29/0676* (2013.01); *H01L 29/0847* (2013.01); *H01L 29/1037* (2013.01); *H01L 29/42356* (2013.01); *H01L 29/66666* (2013.01)

(58) Field of Classification Search
CPC ............ H01L 29/66795; H01L 29/785; H01L 27/0886; H01L 27/0924; H01L 21/02603; H01L 21/823821; H01L 21/845; H01L 27/1211; H01L 29/7827
USPC ............... 257/183, 187, 213, 263, 302, 328; 438/156, 173, 192, 212, 268
See application file for complete search history.

(56) References Cited

U.S. PATENT DOCUMENTS

| | | | |
|---|---|---|---|
| 7,195,959 B1 * | 3/2007 | Plummer | ................ H01L 21/84 257/E21.389 |
| 8,999,805 B1 | 4/2015 | Colinge et al. | |
| 2011/0207409 A1 | 8/2011 | Ker et al. | |
| 2015/0006996 A1 | 1/2015 | Volvovski et al. | |
| 2015/0069475 A1 | 3/2015 | Colinge et al. | |

(Continued)

OTHER PUBLICATIONS

U.S. Appl. No. 14/720,721, filed May 22, 2015.

(Continued)

*Primary Examiner* — Hsien Ming Lee
(74) *Attorney, Agent, or Firm* — Birch, Stewart, Kolasch & Birch, LLP

(57) ABSTRACT

A semiconductor device structure is provided. The semiconductor device structure includes a substrate having a top surface. The semiconductor device structure includes a first pillar structure over the substrate. The first pillar structure includes a first heavily n-doped layer, a first p-doped layer, an n-doped layer, and a first heavily p-doped layer, which are sequentially stacked together. The first pillar structure extends in a direction away from the substrate.

20 Claims, 57 Drawing Sheets

(56) References Cited

U.S. PATENT DOCUMENTS

2015/0069501 A1    3/2015   Colinge et al.
2015/0137067 A1    5/2015   Colinge et al.

OTHER PUBLICATIONS

U.S. Appl. No. 15/058,672, filed Mar. 6, 2016.
"Shockley diode", Wikipedia, 1 page and was last modified on Nov. 21, 2015, https://en.wikipedia.org/wiki/Shockley_diode.
Badwan et al., "On the Nature of the Memory Mechanism of Gated-Thyristor Dynamic-RAM cells", Journal of the Electron Devices Society, vol. 3, No. 6, Nov. 2015, pp. 468-471.
Roy et al., "Thyristor-Based Volatile Memory in Nano-Scale CMOS", IEEE, ISSCC 2006/Session 34/SRAM/34.6, 10 pages.
Sailing et al., "Reliability of Thyristor-based Memory Cells", IEEE CFP09RPS-CDR 47th Annual International Reliability Physics Symposium, Montreal, 2009, pp. 253-259.

* cited by examiner

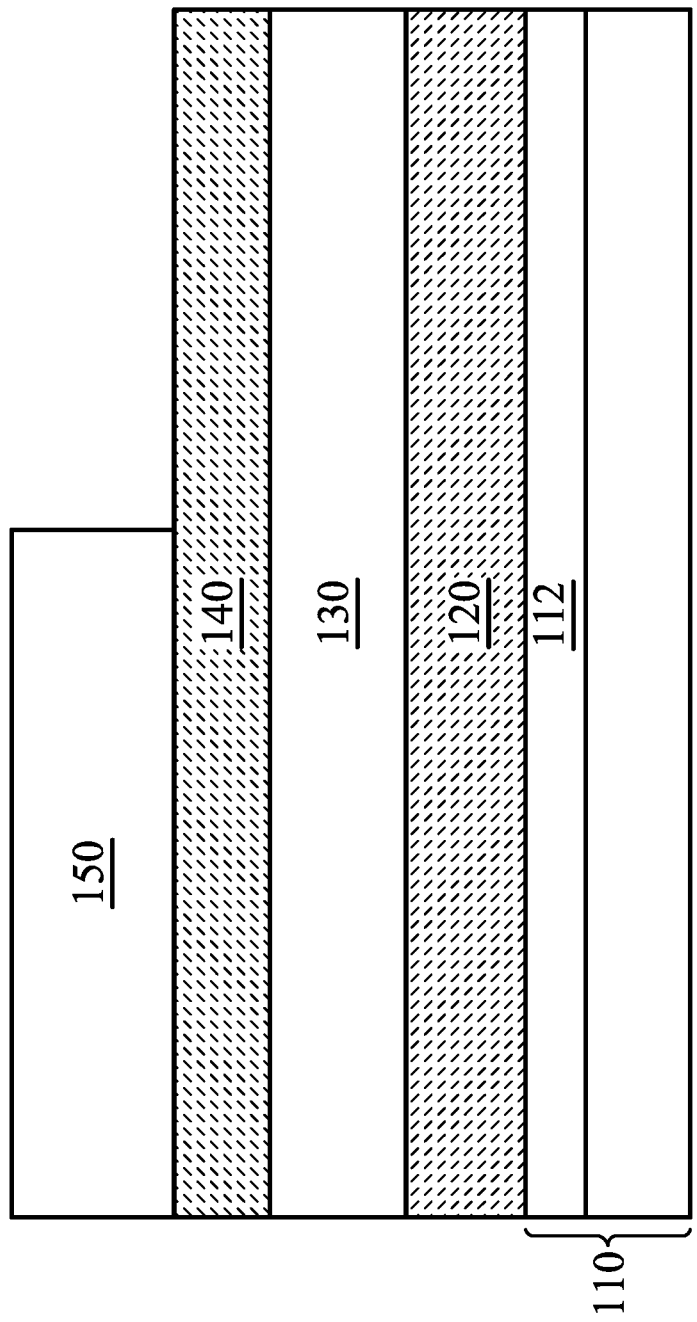

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1P-1 is a perspective view of the semiconductor device structure of FIG. 1P, in accordance with some embodiments.

FIG. 5N-1 is a perspective view of the semiconductor device structure of FIG. 5N, in accordance with some embodiments.

DETAILED DESCRIPTION

Figure 1A:
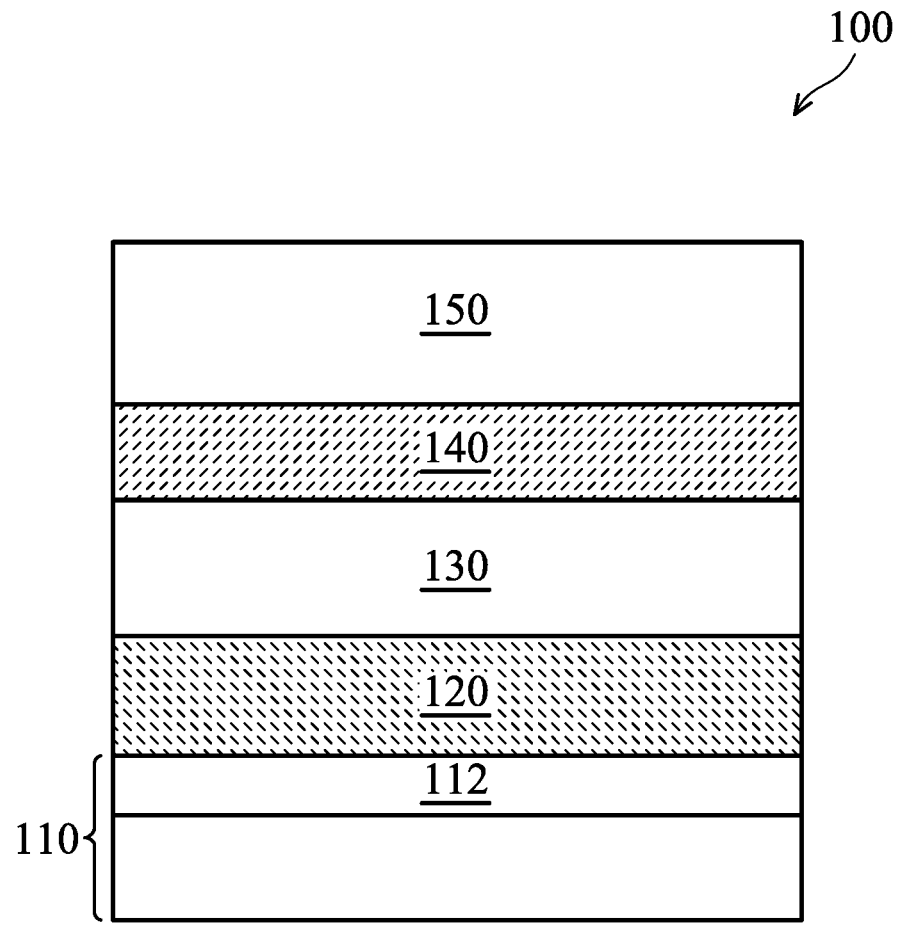
FIGS. 1A-1P are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method. The elements with the same or similar reference number are the same as or similar to each other. The elements with the same or similar reference number are formed by the same or similar methods and the same or similar materials.

Figure 1B:
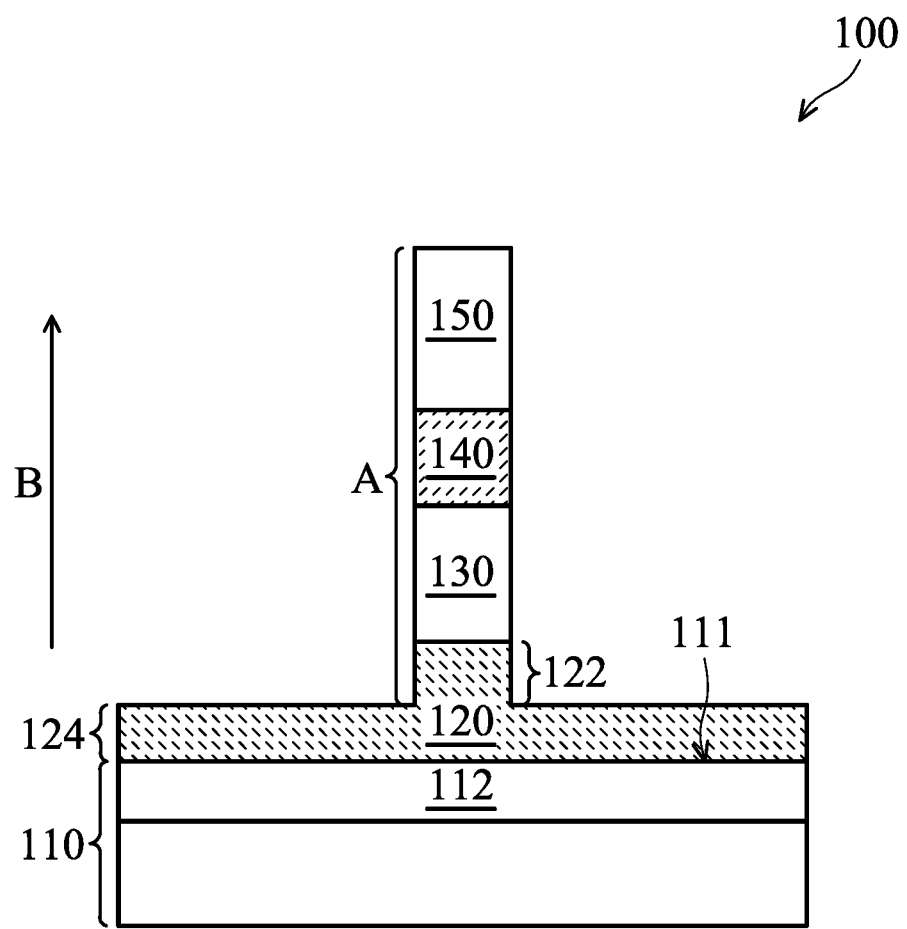
FIG. 1B-1 is a perspective view of the semiconductor device structure of FIG. 1B, in accordance with some embodiments.
Figures 1, 1B:
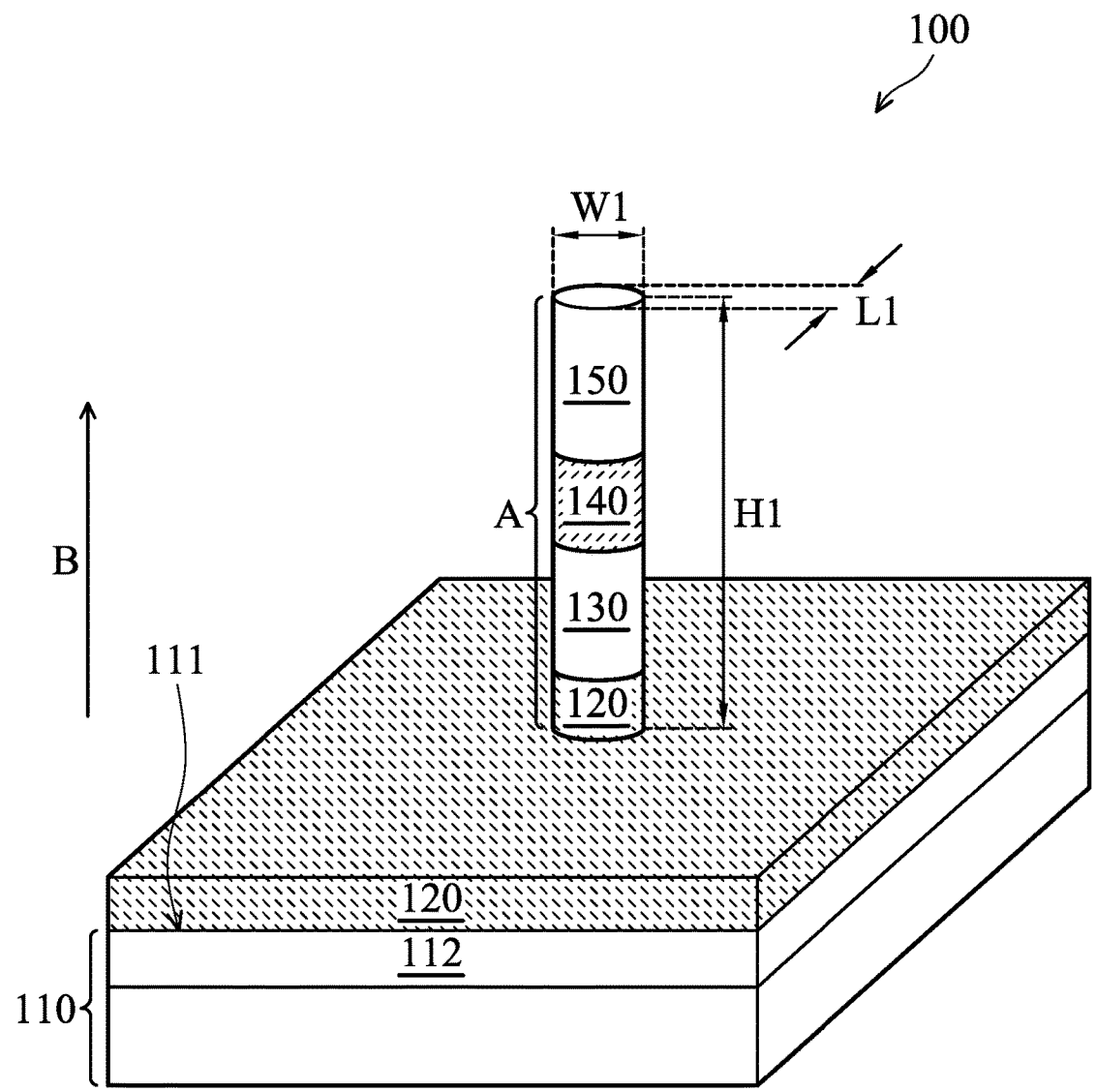
Figure 1C:
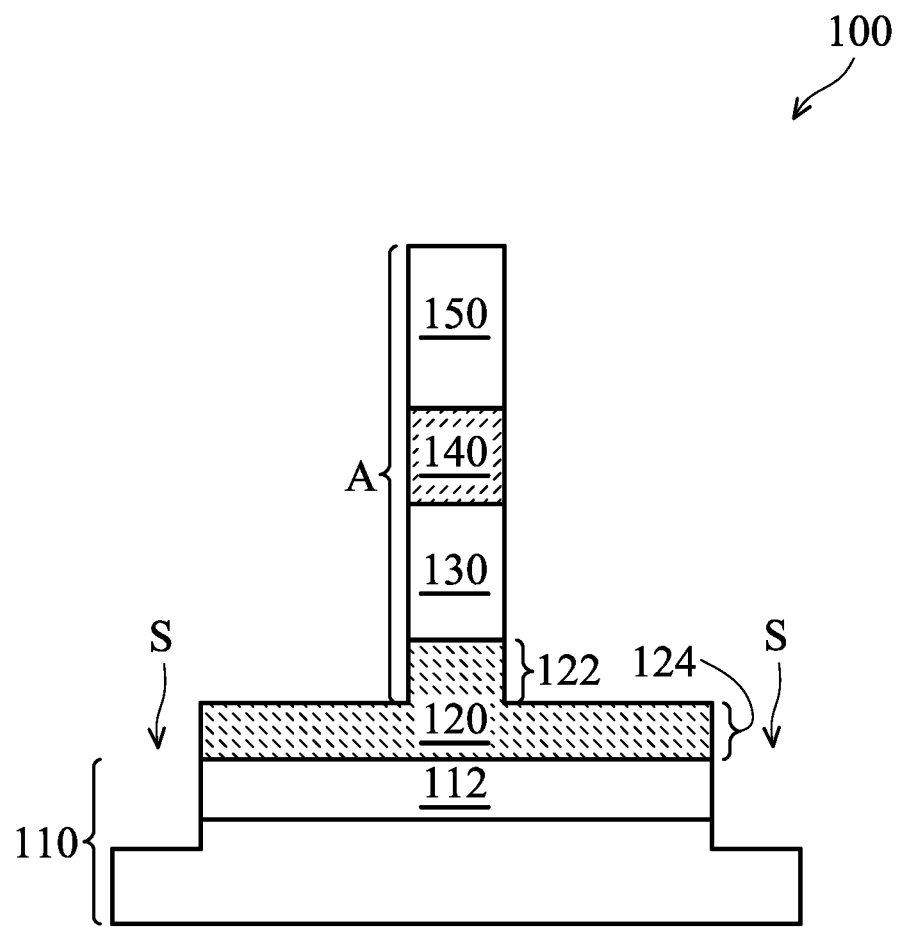
Figure 1D:
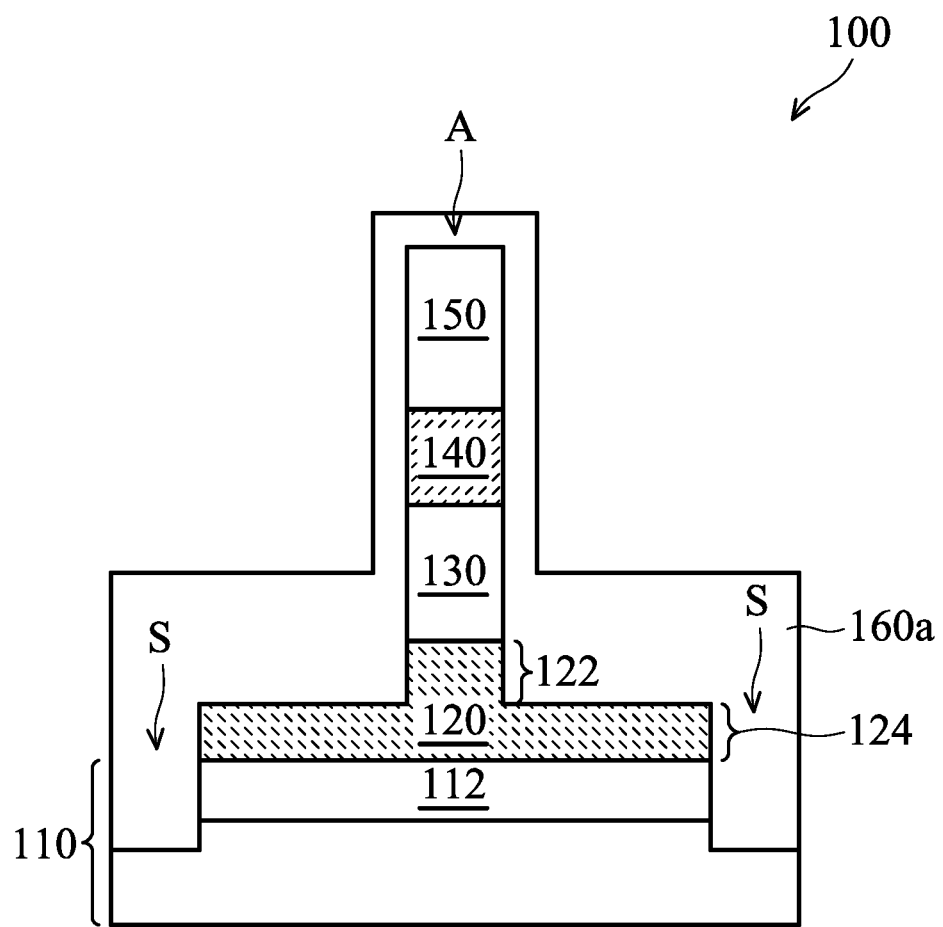
Figure 1E:
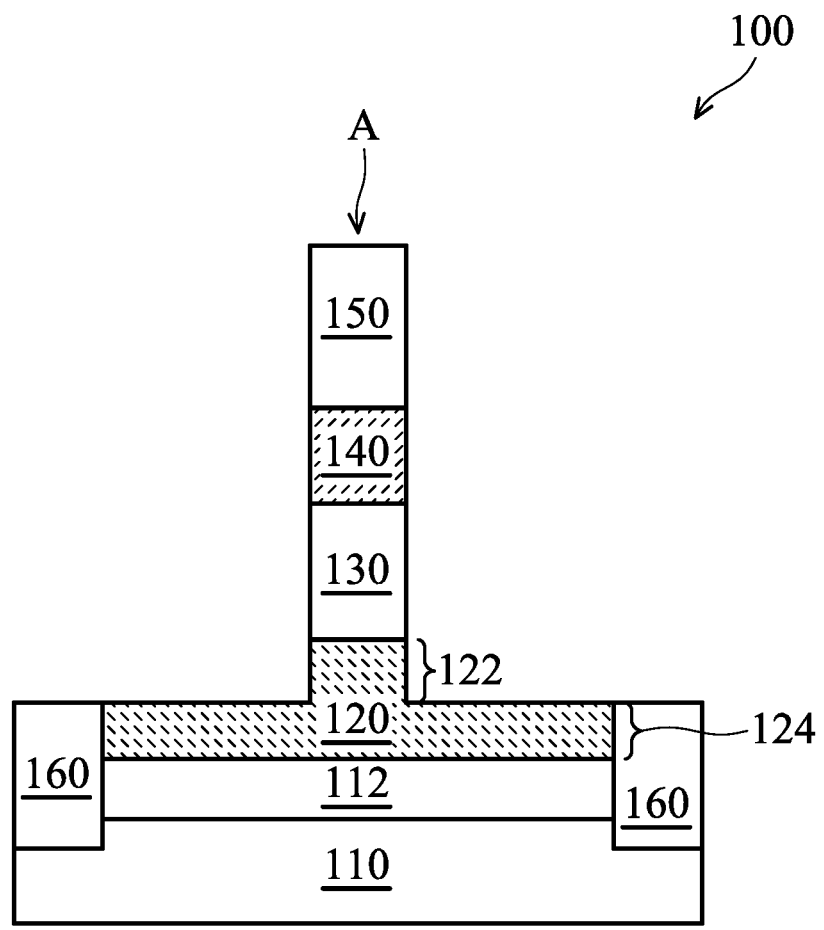
Figure 1F:
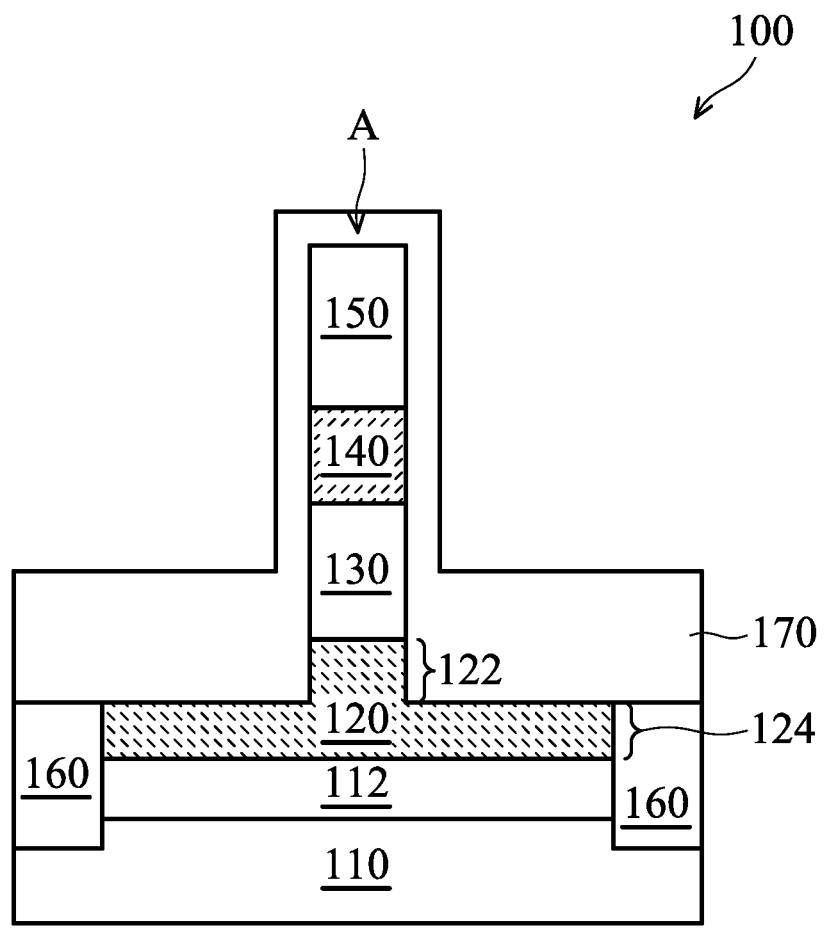
Figure 1G:
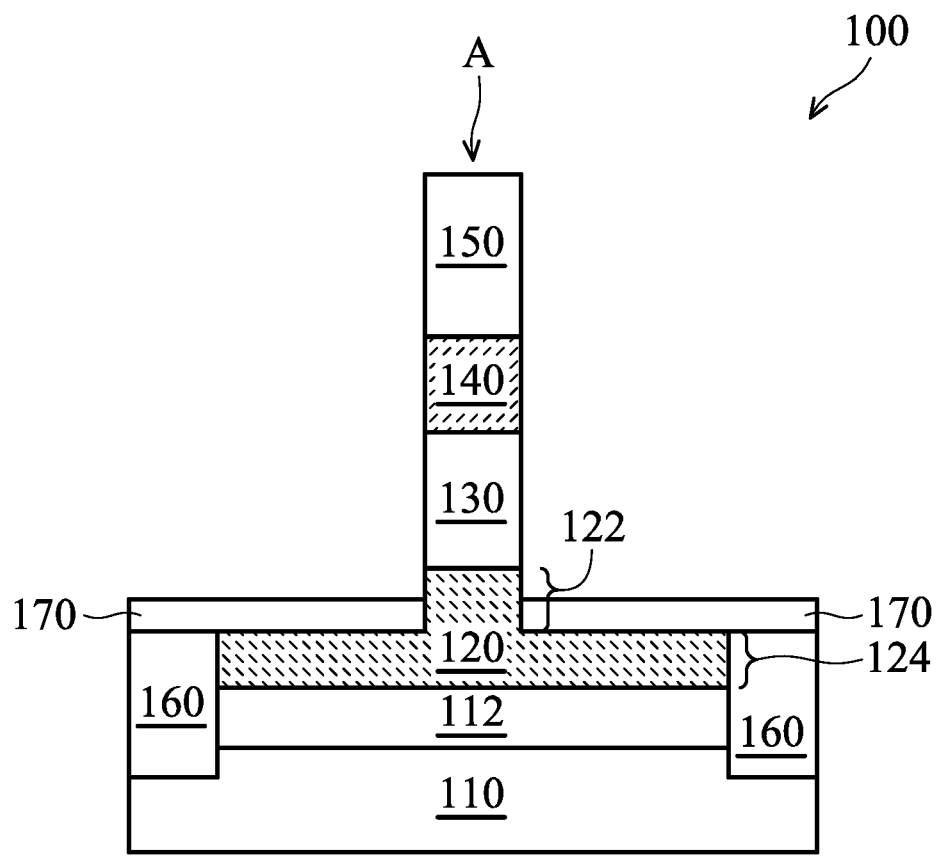
Figure 1H:
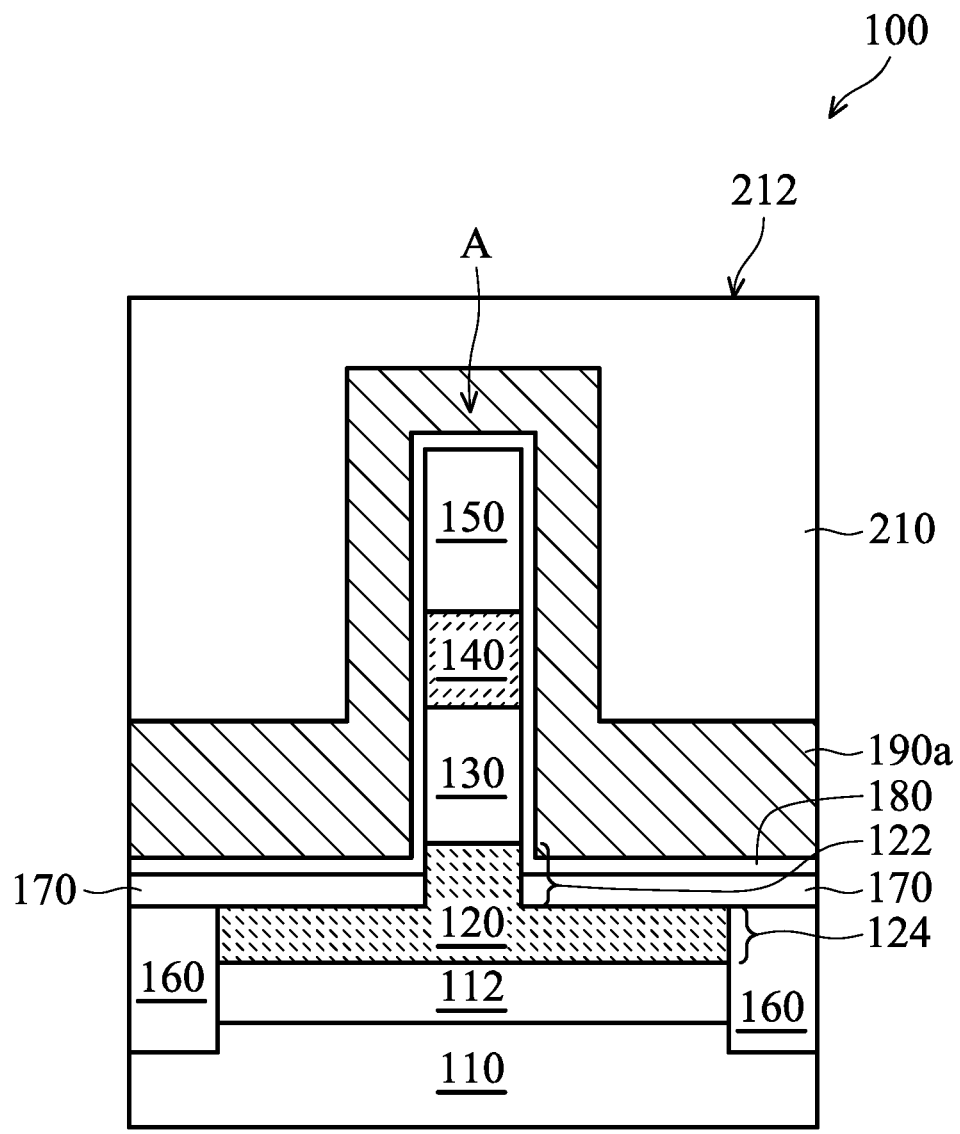
Figure 1I:
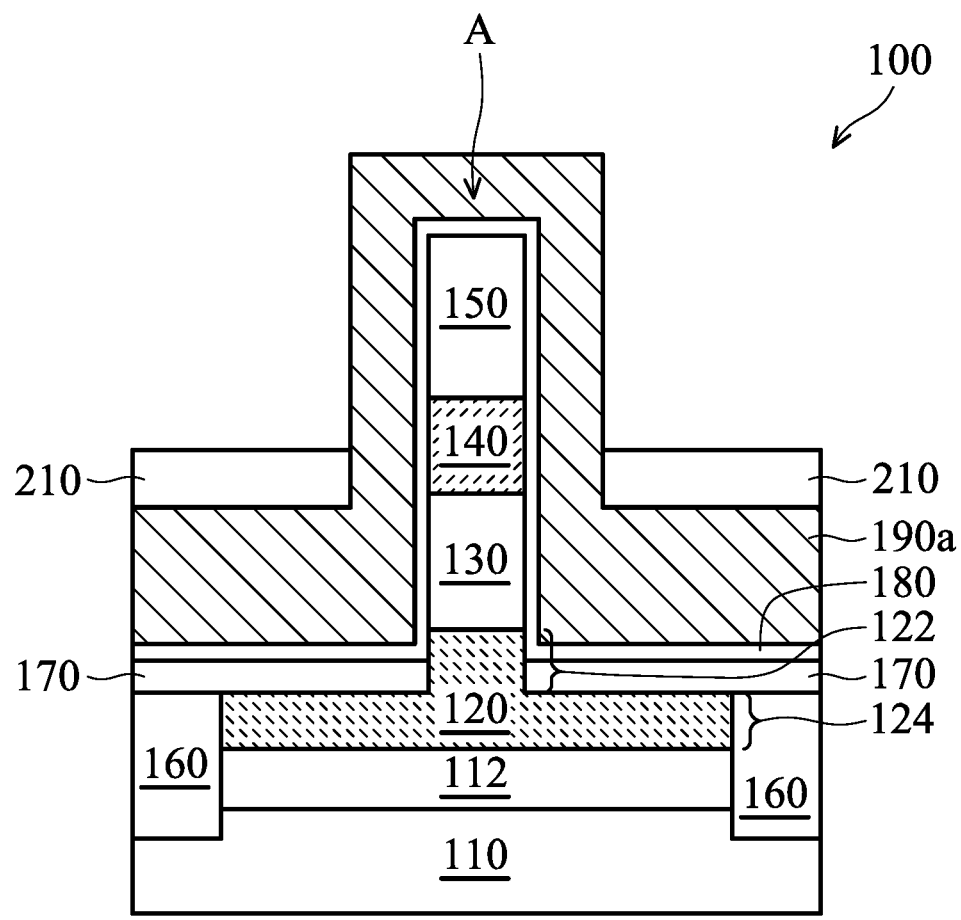
Figure 1J:
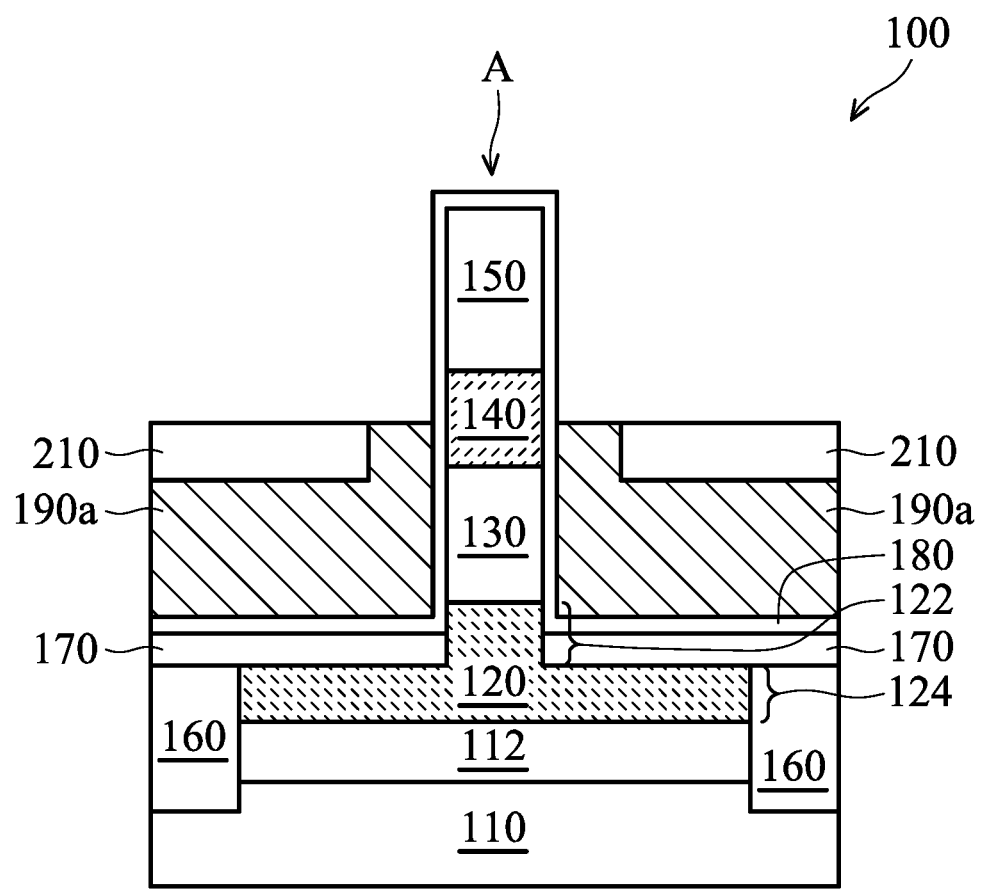
Figure 1K:
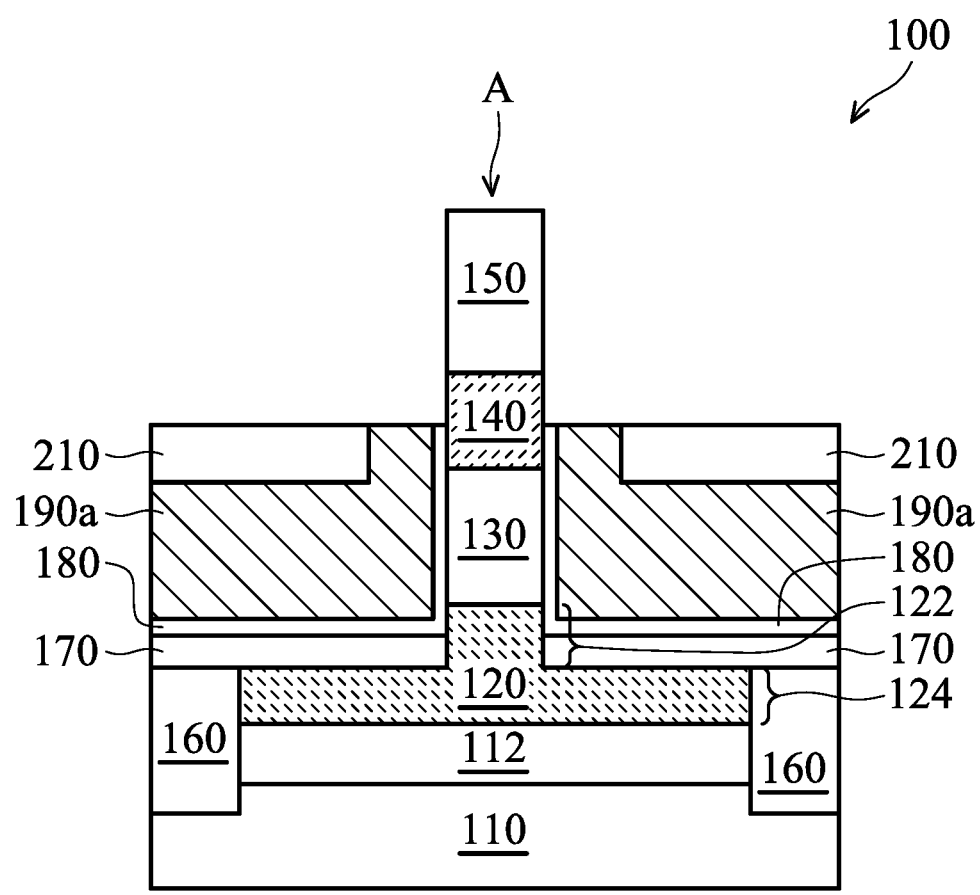
Figure 1L:
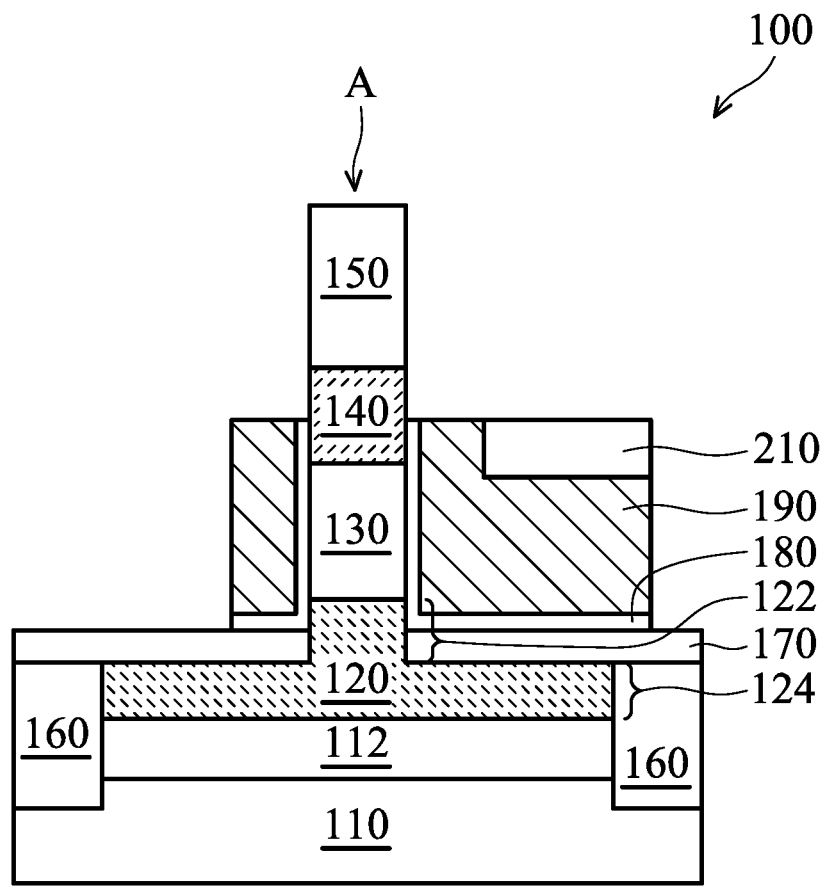
Figure 1M:
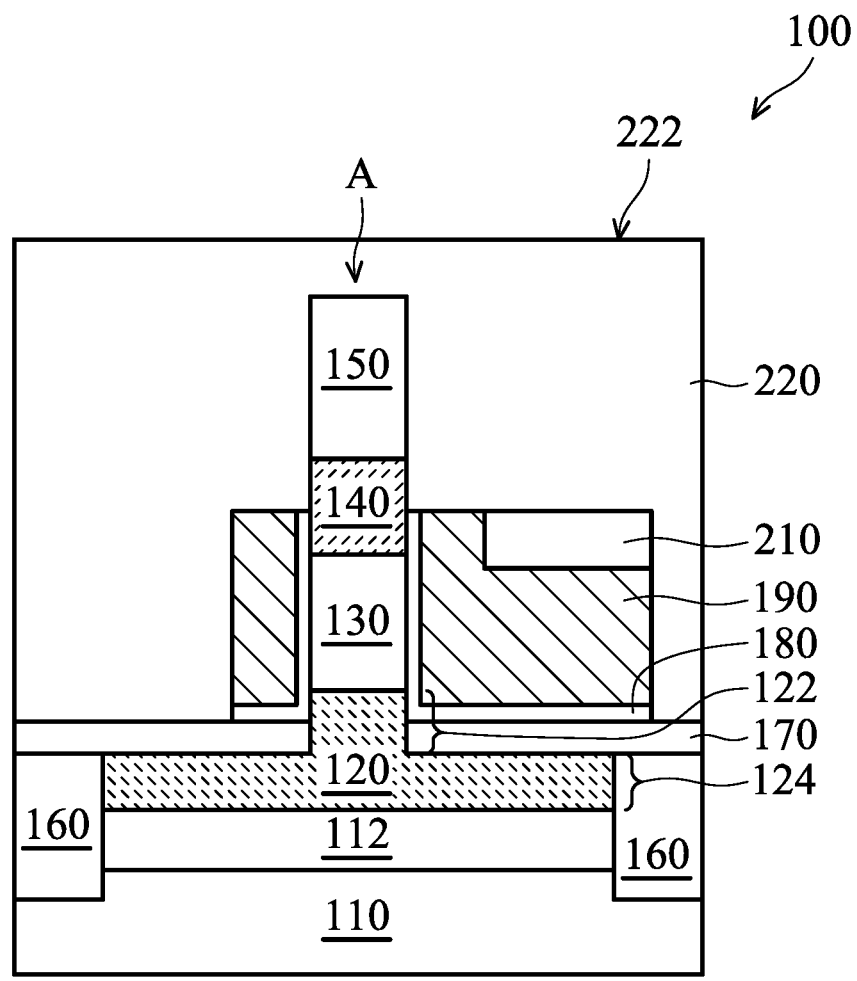
Figure 1N:
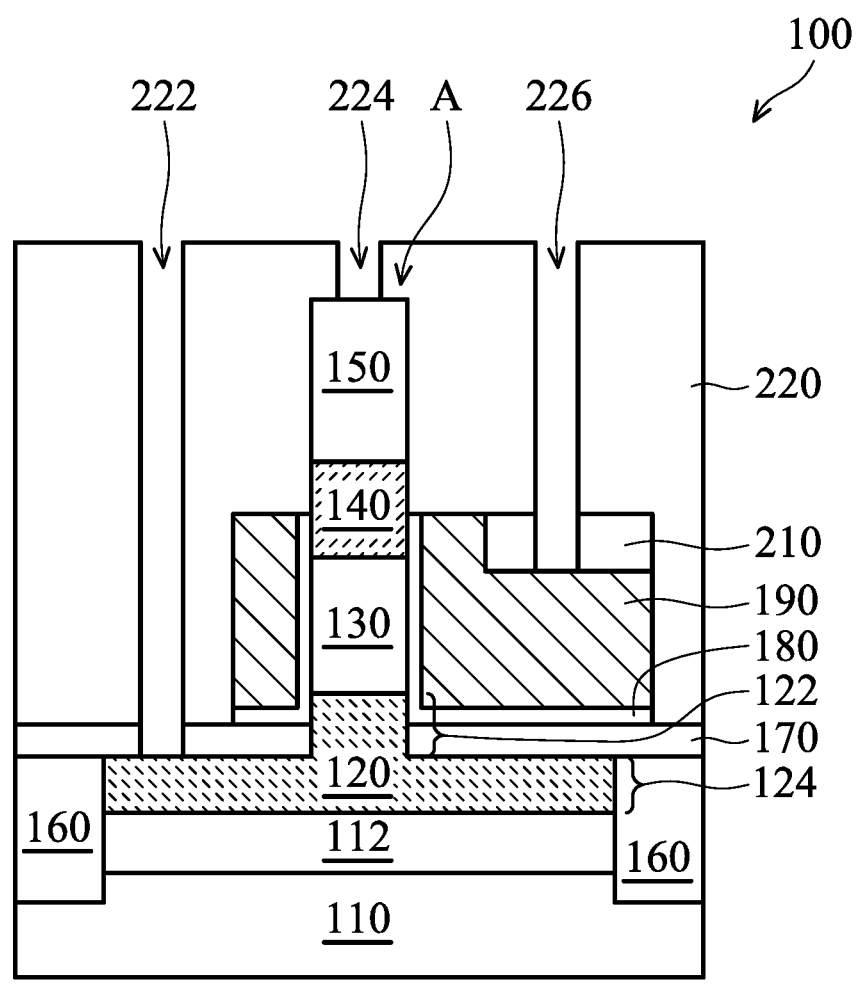
Figure 1O:
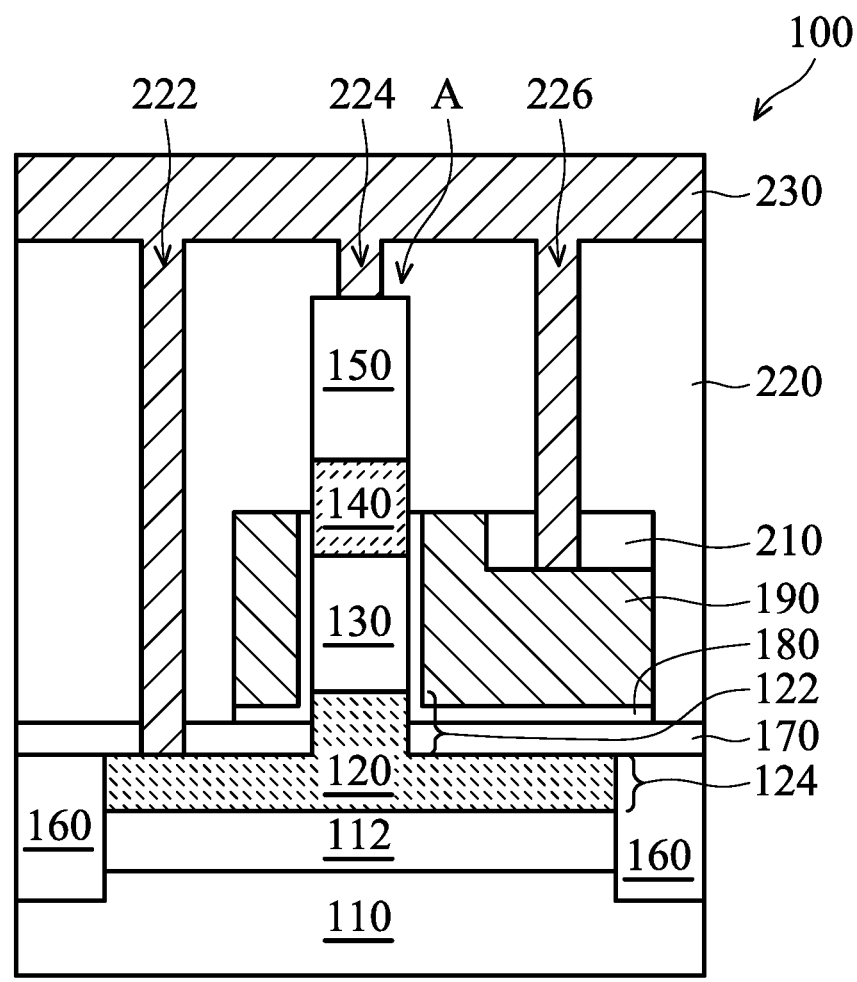
Figure 1P:
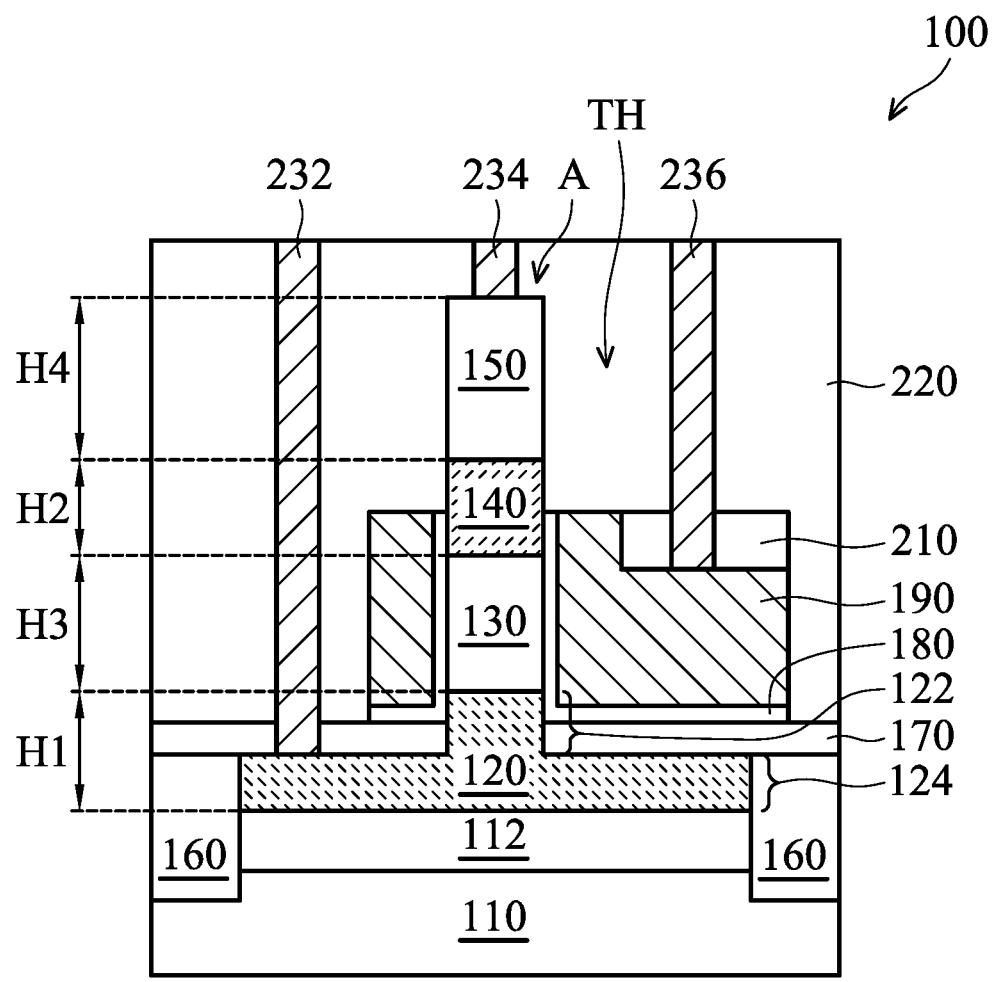
Figures 1, 1P:
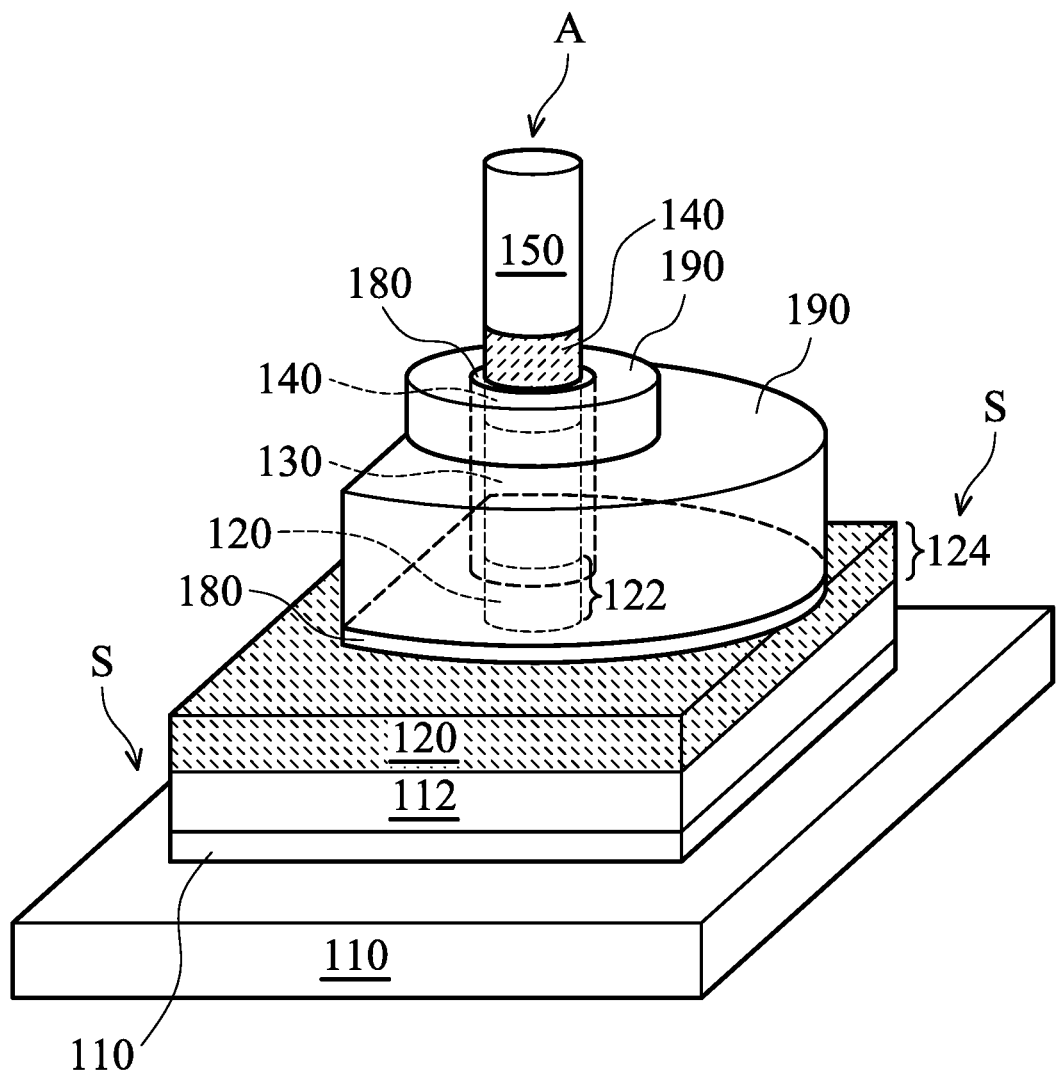

FIGS. 1A-1P are cross-sectional views of various stages of a process for forming a semiconductor device structure 100, in accordance with some embodiments. As shown in FIG. 1A, a substrate 110 is provided, in accordance with some embodiments. The substrate 110 may be a semiconductor wafer such as a silicon wafer. Alternatively or additionally, the substrate 110 may include elementary semiconductor materials, compound semiconductor materials, and/or alloy semiconductor materials.

Examples of the elementary semiconductor materials may be, but are not limited to, crystal silicon, polycrystalline silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, SiC, SiGeSn, GaAsP, AlInAs, AlGaAs, GaInAs, GaInP, and/or GaInAsP. Si, SiGe, Ge, SiGeSn will be referred to as "column IV semiconductors".

As shown in FIG. 1A, a p-well 112 is formed in a top portion of the substrate 110, in accordance with some embodiments. The p-well 112 is doped with p-type dopants, in accordance with some embodiments. The p-type dopants implanted into Group IV semiconductors includes Group III elements (e.g. B, Al, Ga, or In) of the Periodic Table, in accordance with some embodiments. The p-well 112 is formed using an ion implantation process or another suitable process.

As shown in FIG. 1A, a heavily n-doped layer 120 is formed over the p-well 112, in accordance with some embodiments. The heavily n-doped layer 120 includes silicon, silicon germanium, or another suitable semiconductor material. The heavily n-doped layer 120 is doped with n-type dopants, in accordance with some embodiments. In Group IV semiconductors, the n-type dopants include Group V elements (e.g. P, As, or Sb) of the Periodic Table, in accordance with some embodiments. The heavily n-doped layer 120 is formed using an epitaxy process or a deposition process and/or an ion implantation process, in accordance with some embodiments.

As shown in FIG. 1A, a p-doped layer 130 is formed over the heavily n-doped layer 120, in accordance with some embodiments. The p-doped layer 130 includes silicon, silicon germanium, germanium, or another suitable semiconductor material. The p-doped layer 130 is doped with p-type dopants, in accordance with some embodiments. In Group IV semiconductors, the p-type dopants includes Group III elements (e.g. B, Al, Ga, or In) of the Periodic Table, in accordance with some embodiments. The p-doped layer 130 is formed using an epitaxy process or a deposition process and/or an ion implantation process, in accordance with some embodiments.

As shown in FIG. 1A, an n-doped layer 140 is formed over the p-doped layer 130, in accordance with some embodiments. The n-doped layer 140 includes silicon, silicon germanium, germanium, or another suitable semiconductor material. The n-doped layer 140 is doped with n-type dopants, in accordance with some embodiments. In Group IV semiconductors, the n-type dopants include Group V elements (e.g. P, As, or Sb) of the Periodic Table, in accordance with some embodiments.

The n-doped layer 140 is formed using an epitaxy process or a deposition process and/or an ion implantation process, in accordance with some embodiments. The concentration of the n-type dopants in the heavily n-doped layer 120 is greater than the concentration of the n-type dopants in the n-doped layer 140, in accordance with some embodiments.

As shown in FIG. 1A, a heavily p-doped layer 150 is formed over the n-doped layer 140, in accordance with some embodiments. The heavily p-doped layer 150 includes silicon, silicon germanium, or another suitable semiconductor material. The heavily p-doped layer 150 is doped with p-type dopants, in accordance with some embodiments. In Group IV semiconductors the p-type dopants includes Group III elements (e.g. B, Al, Ga, or In) of the Periodic Table, in accordance with some embodiments.

The heavily p-doped layer 150 is formed using an epitaxy process or a deposition process and/or an ion implantation process, in accordance with some embodiments. The concentration of the p-type dopants in the heavily p-doped layer 150 is greater than the concentration of the p-type dopants in the p-doped layer 130, in accordance with some embodiments.

FIG. 1B-1 is a perspective view of the semiconductor device structure 100 of FIG. 1B, in accordance with some embodiments. As shown in FIGS. 1B and 1B-1, portions of the heavily n-doped layer 120, the p-doped layer 130, the n-doped layer 140, and the heavily p-doped layer 150 are removed, in accordance with some embodiments. After the removal process, the remaining p-doped layer 130, the remaining n-doped layer 140, the remaining heavily p-doped layer 150, and the upper portion 122 of the remaining heavily n-doped layer 120 together form a pillar structure A, in accordance with some embodiments.

The pillar structure A is formed over the lower portion 124 of the remaining heavily n-doped layer 120, in accordance with some embodiments. The pillar structure A is connected to the lower portion 124 of the remaining heavily n-doped layer 120, in accordance with some embodiments. The pillar structure A extends in a direction B away from the substrate 110, in accordance with some embodiments. The pillar structure A (or the direction B) is substantially perpendicular to a top surface 111 of the substrate 110, in accordance with some embodiments.

The width W1 of the pillar structure A is less than the height H1 of the pillar structure A, in accordance with some embodiments. The length L1 of the pillar structure A is less than the height H1, in accordance with some embodiments. The height H1 is parallel to the direction B, in accordance with some embodiments. The width W1 and the length L1 are both perpendicular to the direction B, in accordance with some embodiments.

The pillar structure A includes a nanowire, in accordance with some embodiments. The width W1 and the length L1 are both less than 0.1 μm, in accordance with some embodiments. In some embodiments, the length L1 ranges from about 5 nm to about 10 nm. In some embodiments, the width W1 ranges from about 5 nm to about 10 nm.

The pillar structure A may have various lateral cross-sectional shapes. For example, as shown in FIG. 1B-1, the pillar structure A has a circular lateral cross-sectional shape. FIGS. 2A-2F are perspective views of the pillar structure A with various lateral cross-sectional shapes, in accordance with some embodiments.

Figure 2A:
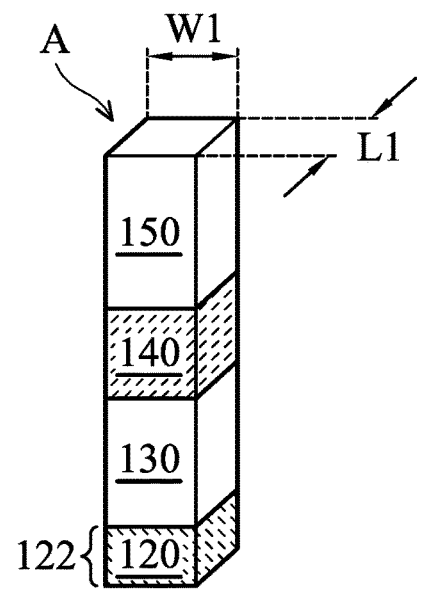
FIGS. 2A-2F are perspective views of the pillar structure with various lateral cross-sectional shapes, in accordance with some embodiments.
Figure 2B:
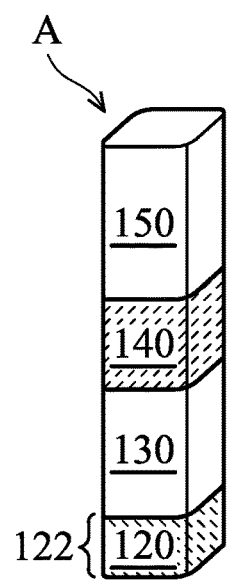
Figure 2C:
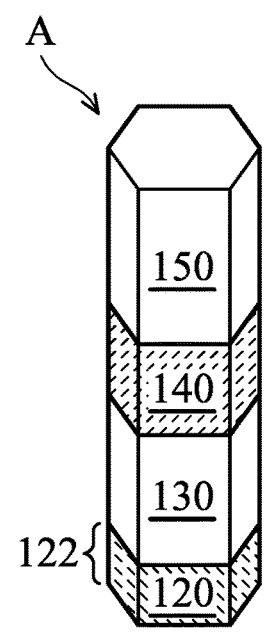

As shown in FIG. 2A, the pillar structure A has a square lateral cross-sectional shape, in accordance with some embodiments. In some embodiments, the length L1 ranges from about 5 nm to about 10 nm. In some embodiments, the width W1 ranges from about 5 nm to about 10 nm. As shown in FIG. 2B, the pillar structure A has a rounded square lateral cross-sectional shape, in accordance with some embodiments. As shown in FIG. 2C, the pillar structure A has a hexagonal lateral cross-sectional shape, in accordance with some embodiments.

Figure 2D:
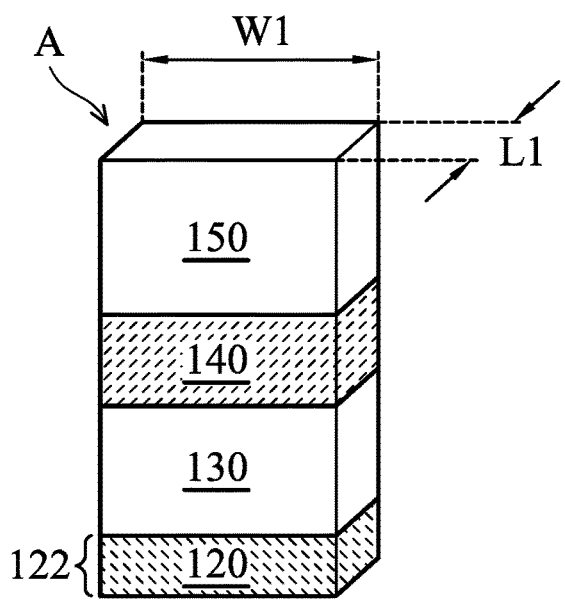
Figure 2E:
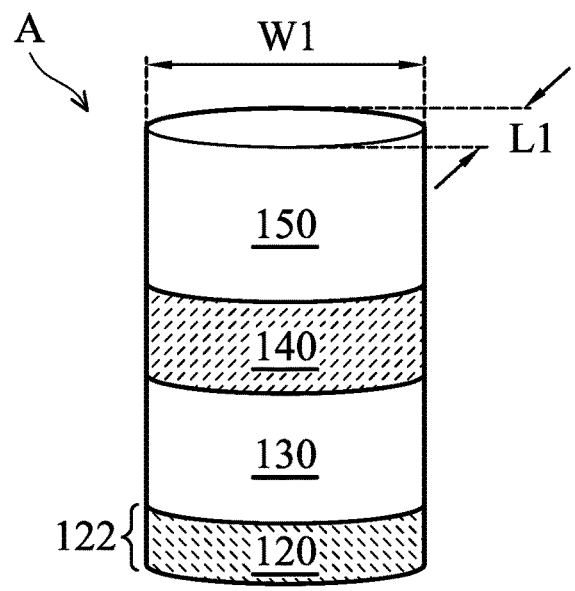
Figure 2F:
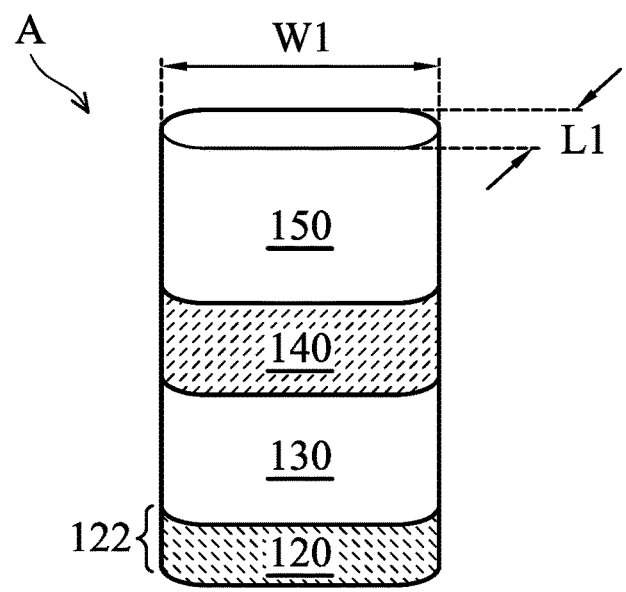

In some embodiments, the pillar structure A has the width W1 greater than the length L1, as shown in FIGS. 2D-2F, in accordance with some embodiments. In some embodiments, the length L1 ranges from about 5 nm to about 10 nm. In some embodiments, the width W1 ranges from about 10 nm to about 50 nm. The pillar structure A with the width W1 greater than the length L1 is able to sustain a large current, and therefore the pillar structure A is able to be used in a large current device, in accordance with some embodiments.

As shown in FIG. 2D, the pillar structure A has a rectangular lateral cross-sectional shape, in accordance with some embodiments. As shown in FIG. 2E, the pillar structure A has an elliptical lateral cross-sectional shape, in accordance with some embodiments. As shown in FIG. 2F, the pillar structure A has a bar-like lateral cross-sectional shape, in accordance with some embodiments.

As shown in FIG. 1C, portions of the substrate 110 and the lower portion 124 of the heavily n-doped layer 120 are removed, in accordance with some embodiments. The removal process forms a trench S in the substrate 110 and the heavily n-doped layer 120, in accordance with some embodiments. The trench S surrounds the heavily n-doped layer 120 and the p-well 112, in accordance with some embodiments. The trench S is formed using a photolithography process and an etching process, in accordance with some embodiments. The etching process includes a dry etching process, in accordance with some embodiments.

As shown in FIG. 1D, an isolation layer 160a is formed over the substrate 110 to fill the trench S, in accordance with some embodiments. The isolation layer 160a covers the pillar structure A and the heavily n-doped layer 120, in accordance with some embodiments. The isolation layer 160a includes a dielectric material, in accordance with some embodiments. The dielectric material includes silicon oxide or another suitable dielectric material. The isolation layer 160a is formed using a spin-on-glass process or another suitable process.

As shown in FIG. 1E, the isolation layer 160a outside of the trench S is removed, in accordance with some embodiments. The remaining isolation layer 160a forms an isolation structure 160, in accordance with some embodiments. The isolation structure 160 surrounds the heavily n-doped layer 120, the pillar structure A, and the p-well 112, in accordance with some embodiments. The isolation structure 160 is configured to define and electrically isolate the pillar structure A (or the p-well 112) and various device elements (not shown) formed in the semiconductor substrate 110, in accordance with some embodiments.

Examples of device elements may include, but are not limited to, transistors, diodes, and/or other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, or the like. Various processes are performed to form the device elements, such as deposition, etching, implantation, photolithography, annealing, and/or other applicable processes.

As shown in FIG. 1F, a dielectric layer 170 is formed over the isolation structure 160, the heavily n-doped layer 120, and the pillar structure A, in accordance with some embodiments. The dielectric layer 170 over the pillar structure A is thinner than the dielectric layer 170 over the isolation structure 160 and the lower portion 124 of the heavily n-doped layer 120, in accordance with some embodiments. The dielectric layer 170 includes silicon oxide or another suitable dielectric material. The dielectric layer 170 is formed using a spin-on-glass process or another suitable process.

As shown in FIG. 1G, the dielectric layer 170 is thinned, in accordance with some embodiments. After the thinning process, the dielectric layer 170 exposes the p-doped layer 130, the n-doped layer 140, the heavily p-doped layer 150, and a portion of the upper portion 122, in accordance with some embodiments. The thinning process includes a wet etching process, in accordance with some embodiments.

As shown in FIG. 1H, a gate dielectric layer 180 is formed over the dielectric layer 170 and the pillar structure A, in accordance with some embodiments. The gate dielectric layer 180 is made of silicon oxide, silicon oxynitride, a combination thereof, or another suitable material. In some embodiments, the gate dielectric layer 180 includes a high dielectric constant material (high-k material), in accordance with some embodiments.

The high-k material includes metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, another suitable material, or a combination thereof, in accordance with some embodiments.

The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or a combination thereof, in accordance with some embodiments. The gate dielectric layer 180 is formed using a chemical vapor deposition process or another suitable process.

As shown in FIG. 1H, a gate material layer 190a is formed over the gate dielectric layer 180, in accordance with some embodiments. The gate material layer 190a includes a conductive material, in accordance with some embodiments. The conductive material includes a metal material or a polysilicon material, in accordance with some embodiments. The metal material includes aluminum, tungsten, platinum, cobalt, doped polysilicon, TiN, TaN, Ta, titanium carbon nitride, titanium aluminum nitride, or other suitable metal, alloy thereof, or a combination thereof, in accordance with some embodiments. The gate material layer 190a is formed using a PVD process, a CVD process, an ALD process, a plating process, the like, or a combination thereof, in accordance with some embodiments.

As shown in FIG. 1H, a dielectric layer 210 is formed over the gate material layer 190a, in accordance with some embodiments. The dielectric layer 210 has a substantially planar top surface 212, in accordance with some embodiments. The dielectric layer 210 includes oxide, such as $SiO_2$, borophosphosilicate glass (BPSG), spin on glass (SOG), undoped silicate glass (USG), fluorinated silicate glass (FSG), high-density plasma (HDP) oxide, or plasma-enhanced TEOS (PETEOS), in accordance with some embodiments.

The dielectric layer 210 is formed using a deposition process, such as a chemical vapor deposition (CVD) process, a physical vapor deposition (PVD) process, or a spin-on coating process, in accordance with some embodiments. The dielectric layer 210 is formed further using a chemical mechanical polishing process, in accordance with some embodiments.

As shown in FIG. 1I, an upper portion of the dielectric layer 210 is removed, in accordance with some embodiments. The remaining dielectric layer 210 exposes an upper portion of the gate material layer 190a, in accordance with some embodiments. The removal process includes a wet etching process or another suitable etching process.

As shown in FIG. 1J, the upper portion of the gate material layer 190a is removed, in accordance with some embodiments. The remaining gate material layer 190a exposes an upper portion of the gate dielectric layer 180, in accordance with some embodiments. The removal process includes a wet etching process or a dry etching process, in accordance with some embodiments.

As shown in FIG. 1K, the upper portion of the gate dielectric layer 180 is removed, in accordance with some embodiments. The remaining gate dielectric layer 180 exposes the heavily p-doped layer 150 and an upper portion of the n-doped layer 140, in accordance with some embodiments. The removal process includes a wet etching process or a dry etching process, in accordance with some embodiments.

As shown in FIG. 1L, a patterning process is performed to remove portions of the dielectric layer 210, the gate material layer 190a, and the gate dielectric layer 180, in accordance with some embodiments. The remaining gate material layer 190a forms a gate electrode 190, in accordance with some embodiments. The patterning process includes a photolithography process and one or more etching processes, in accordance with some embodiments.

As shown in FIG. 1M, a dielectric layer 220 is formed over the pillar structure A, the dielectric layers 210 and 170, the gate electrode 190, and the gate dielectric layer 180, in accordance with some embodiments. The dielectric layer 220 has a substantially planar top surface 222, in accordance with some embodiments.

The dielectric layer 220 includes oxide, such as $SiO_2$, borophosphosilicate glass (BPSG), spin on glass (SOG), undoped silicate glass (USG), fluorinated silicate glass (FSG), high-density plasma (HDP) oxide, or plasma-enhanced TEOS (PETEOS), in accordance with some embodiments. The dielectric layer 220 is formed using a deposition process, such as a chemical vapor deposition (CVD) process, a physical vapor deposition (PVD) process, or a spin-on coating process, in accordance with some embodiments.

As shown in FIG. 1N, through holes 222, 224, and 226 are formed in the dielectric layer 220, in accordance with some embodiments. The through hole 226 further passes through the dielectric layer 210, in accordance with some embodiments. The through holes 222, 224, and 226 expose the lower portion 124 of the heavily n-doped layer 120, the heavily p-doped layer 150, and the gate electrode 190, respectively, in accordance with some embodiments.

As shown in FIG. 1O, a conductive layer 230 is deposited over the dielectric layer 220 and is filled into the through holes 222, 224, and 226, in accordance with some embodiments. The conductive layer 230 is made of tungsten or another suitable conductive material. The conductive layer 230 is formed by a CVD process, a PECVD process, an ALD process or another suitable process.

As shown in FIG. 1P, the conductive layer 230 outside of the through holes 222, 224, and 226 is removed, in accordance with some embodiments. The remaining conductive layer 230 in the through holes 222, 224, and 226 form contact structures 232, 234, and 236, respectively, in accordance with some embodiments. The contact structures 232, 234, and 236 are electrically connected to the heavily n-doped layer 120, the heavily p-doped layer 150, and the gate electrode 190, respectively, in accordance with some embodiments.

FIG. 1P-1 is a perspective view of the semiconductor device structure 100 of FIG. 1P, in accordance with some embodiments. For the sake of simplicity, the isolation structure 160, the dielectric layers 170, 210, and 220, and the contact structures 232, 234, and 236 are omitted, in accordance with some embodiments.

As shown in FIGS. 1P and 1P-1, the gate electrode 190 and the gate dielectric layer 180 horizontally and continuously surround the pillar structure A, in accordance with some embodiments. The gate electrode 190 and the gate dielectric layer 180 horizontally and continuously surround the p-doped layer 130, in accordance with some embodiments. The gate electrode 190 and the pillar structure A together form a thyristor TH, in accordance with some embodiments.

The heavily n-doped layer 120, the p-doped layer 130, the n-doped layer 140, and the heavily p-doped layer 150 are sequentially stacked together, in accordance with some embodiments. The heavily n-doped layer 120, the p-doped layer 130, the n-doped layer 140, and the heavily p-doped layer 150 are sequentially stacked over the substrate 110, in accordance with some embodiments. The heavily n-doped layer 120, the p-doped layer 130, the n-doped layer 140, and the heavily p-doped layer 150 are sequentially connected in series, in accordance with some embodiments.

As shown in FIGS. 1P and 1P-1, the lower portion 124 of the heavily n-doped layer 120 is wider than the pillar structure A, in accordance with some embodiments. The gate dielectric layer 180 is between the gate electrode 190 and the p-doped layer 130 and between the gate electrode 190 and the lower portion 124 of the heavily n-doped layer 120, in accordance with some embodiments. The height H1 of the heavily n-doped layer 120 is greater than the height H2 of the n-doped layer 140, in accordance with some embodiments. The height H4 of the heavily p-doped layer 150 is greater than the height H3 of the p-doped layer 130, in accordance with some embodiments.

Figure 3:
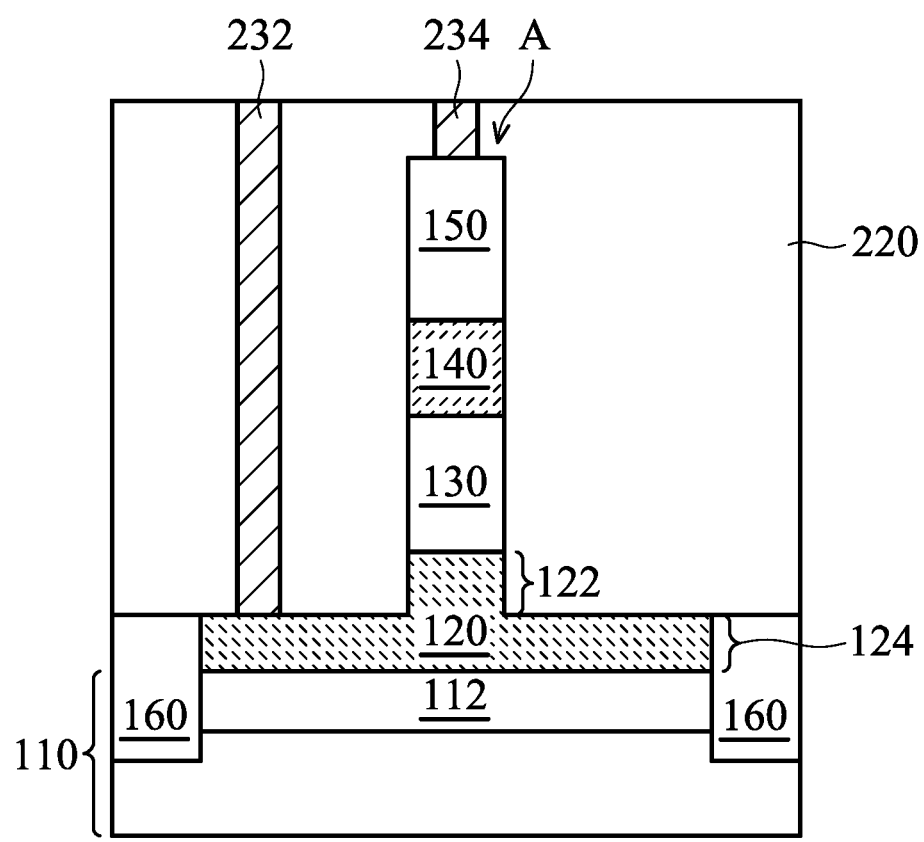
FIG. 3 is a variation of the semiconductor device structure of FIG. 1P, in accordance with some embodiments.

In some embodiments, as shown in FIG. 3, the dielectric layers 170 and 210, the gate dielectric layer 180, the gate electrode 190, and the contact structure 236 are not formed. The pillar structure A includes a Shockley diode, in accordance with some embodiments.

Figure 4A:
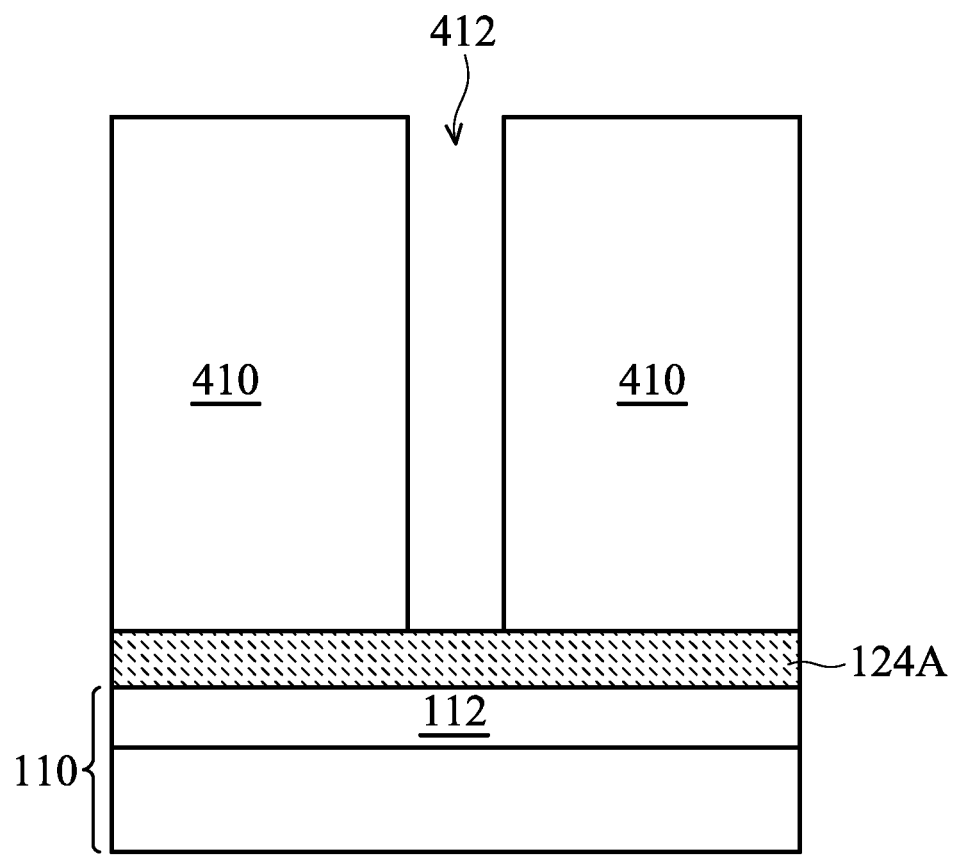
FIGS. 4A-4C are cross-sectional views of various stages of a process for forming a semiconductor device structure, in accordance with some embodiments.
Figure 4B:
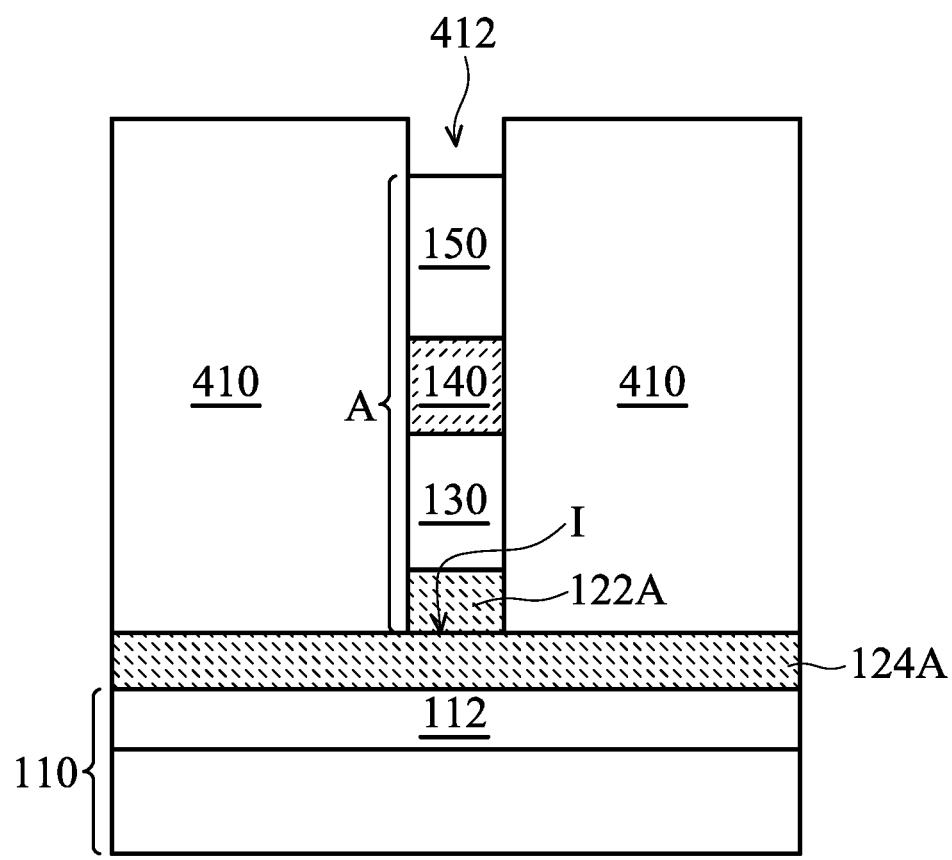
Figure 4C:
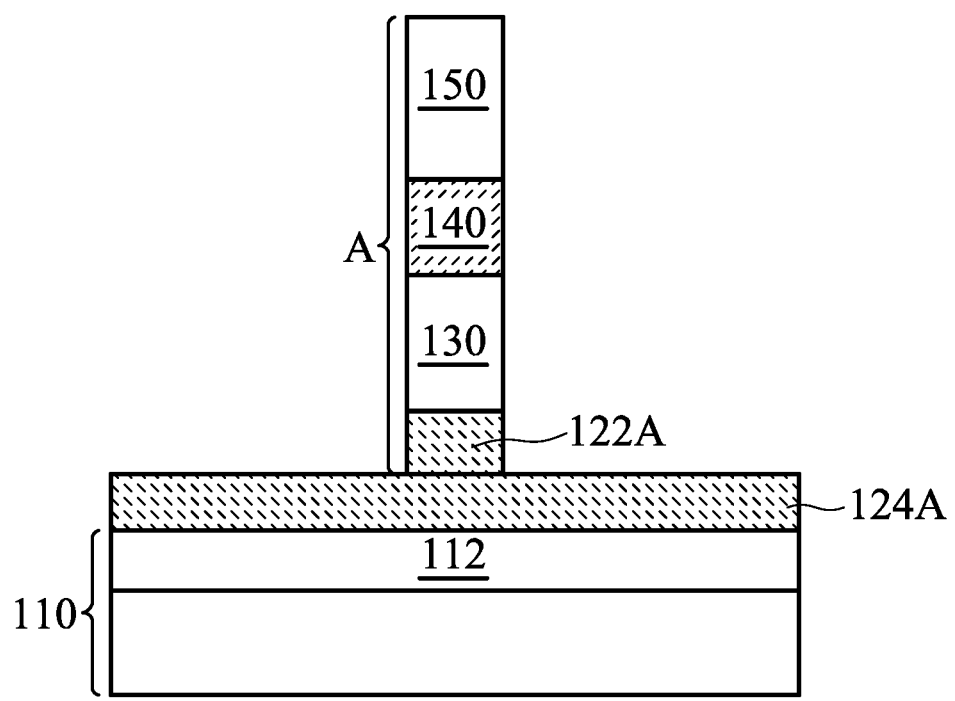

The pillar structure A may be formed using another method. FIGS. 4A-4C are cross-sectional views of various stages of a process for forming a semiconductor device structure, in accordance with some embodiments. As shown in FIG. 4A, a heavily n-doped layer 124A is formed over the p-well 112, in accordance with some embodiments. The heavily n-doped layer 124A includes silicon, silicon germanium, germanium, or another suitable semiconductor material. The heavily n-doped layer 124A is formed using an epitaxy process or a deposition process and/or an ion implantation process, in accordance with some embodiments.

As shown in FIG. 4A, a mask layer 410 is formed over the heavily n-doped layer 124A, in accordance with some embodiments. The mask layer 410 has a through hole 412 exposing a portion of the heavily n-doped layer 124A, in accordance with some embodiments. The mask layer 410 includes a dielectric material or a polymer material, in accordance with some embodiments. The mask layer 410 is formed using a deposition process and an etching process or using a photolithography process, in accordance with some embodiments.

As shown in FIG. 4B, a heavily n-doped layer 122A is formed in the through hole 412 and over the heavily n-doped layer 124A, in accordance with some embodiments. The heavily n-doped layer 122A includes silicon, silicon germanium, or another suitable semiconductor material. The heavily n-doped layers 122A and 124A are made of the same material, in accordance with some embodiments. There is an interface I between the heavily n-doped layers 122A and 124A, in accordance with some embodiments. The heavily n-doped layer 122A is formed using an epitaxy process, in accordance with some embodiments.

As shown in FIG. 4B, a p-doped layer 130 is formed in the through hole 412 and over the heavily n-doped layer 122A, in accordance with some embodiments. The p-doped layer 130 includes silicon, silicon germanium, germanium, or another suitable semiconductor material. The p-doped layer 130 is formed using an epitaxy process, in accordance with some embodiments.

As shown in FIG. 4B, an n-doped layer 140 is formed in the through hole 412 and over the p-doped layer 130, in accordance with some embodiments. The n-doped layer 140 includes silicon, silicon germanium, germanium, or another suitable semiconductor material. The n-doped layer 140 is formed using an epitaxy process, in accordance with some embodiments. The concentration of n-type dopants in the heavily n-doped layer 122A or 124A is greater than the concentration of n-type dopants in the n-doped layer 140, in accordance with some embodiments.

As shown in FIG. 4B, a heavily p-doped layer 150 is formed in the through hole 412 and over the n-doped layer 140, in accordance with some embodiments. The heavily p-doped layer 150 includes silicon, silicon germanium, or another suitable semiconductor material. The heavily p-doped layer 150 is formed using an epitaxy process, in accordance with some embodiments. The concentration of p-type dopants in the heavily p-doped layer 150 is greater than the concentration of p-type dopants in the p-doped layer 130, in accordance with some embodiments.

As shown in FIG. 4C, the mask layer 410 is removed, in accordance with some embodiments. The removal process includes an etching process or a photoresist striping process, in accordance with some embodiments. The heavily n-doped layer 122A, the p-doped layer 130, the n-doped layer 140, and the heavily p-doped layer 150 together form a pillar structure A, in accordance with some embodiments.

In some embodiments, the thyristor TH is formed in a thyristor random access memory cell (thyristor RAM cell). One of the methods for forming a thyristor RAM cell is described as follows. FIGS. 5A-5N are cross-sectional views of various stages of a process for forming a semiconductor device structure 500, in accordance with some embodiments.

After the formation of the p-well 112 in the substrate 110 and the formation of the heavily n-doped layer 120, the p-doped layer 130, the n-doped layer 140 over the substrate 110 of FIG. 1A, as shown in FIG. 5A, a heavily p-doped layer 150 is formed over a first portion of the n-doped layer 140, in accordance with some embodiments. The heavily p-doped layer 150 exposes a second portion of the n-doped layer 140, in accordance with some embodiments.

The heavily p-doped layer 150 includes silicon, silicon germanium, or another suitable semiconductor material. The heavily p-doped layer 150 is formed using an epitaxy process, in accordance with some embodiments. The formation of the heavily p-doped layer 150 includes forming a mask layer (not shown) over the second portion of the n-doped layer 140; epitaxying the heavily p-doped layer 150 on the first portion of the n-doped layer 140; and removing the mask layer.

Figure 5B:
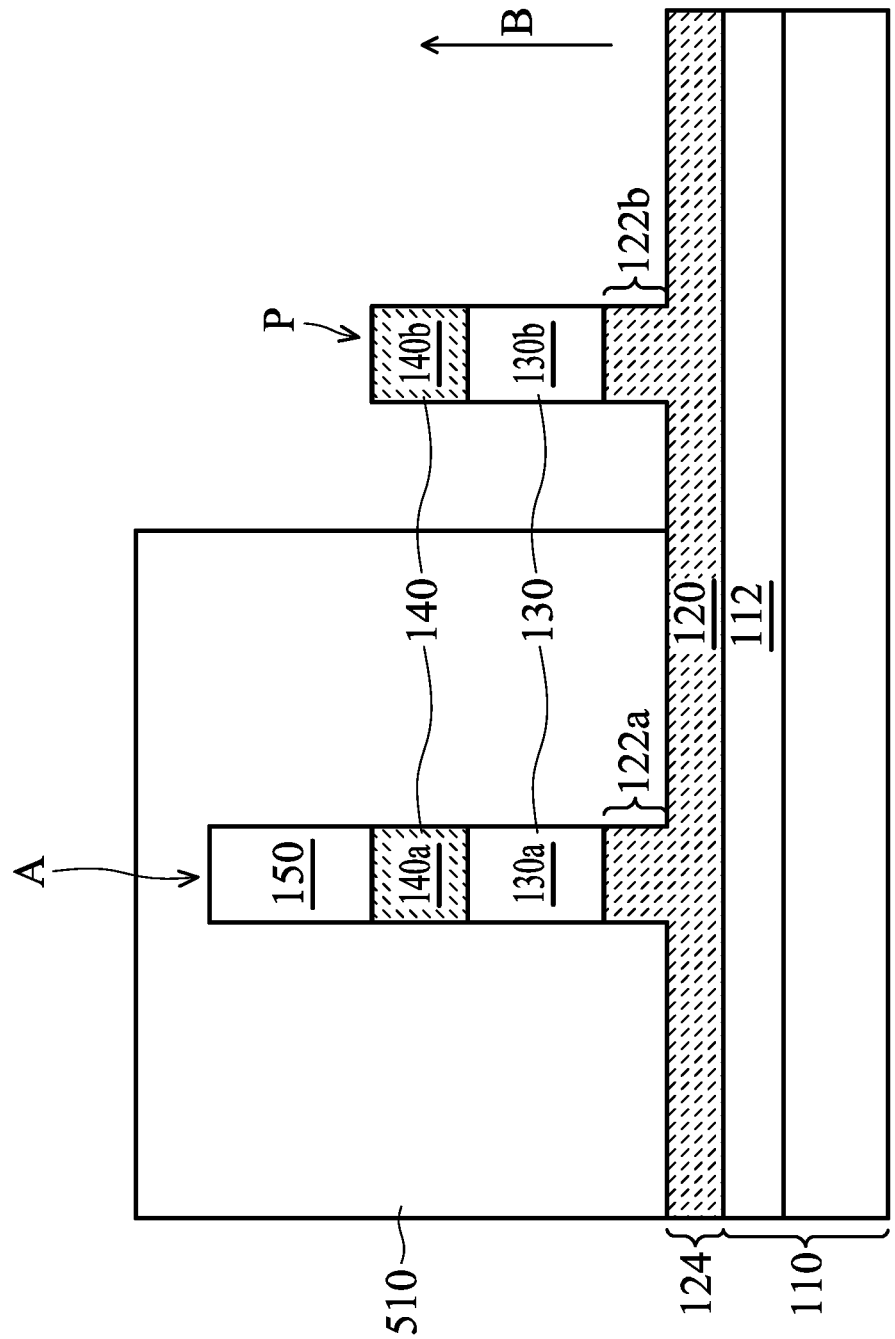
FIGS. 5A-5N are cross-sectional views of various stages of a process for forming a semiconductor device structure, in accordance with some embodiments.

As shown in FIG. 5B, portions of the heavily n-doped layer 120, the p-doped layer 130, the n-doped layer 140, and the heavily p-doped layer 150 are removed, in accordance with some embodiments. After the removal process, the remaining heavily n-doped layer 120 includes upper portions 122a and 122b and a lower portion 124, in accordance with some embodiments. The upper portions 122a and 122b are on the lower portion 124 and spaced apart from each other, in accordance with some embodiments.

The remaining p-doped layer 130 includes p-doped layers 130a and 130b, in accordance with some embodiments. The p-doped layers 130a and 130b are spaced apart from each other, in accordance with some embodiments. The p-doped layers 130a and 130b are over the upper portions 122a and 122b, respectively, in accordance with some embodiments.

The remaining n-doped layer 140 includes n-doped layers 140a and 140b, in accordance with some embodiments. The n-doped layers 140a and 140b are spaced apart from each other, in accordance with some embodiments. The n-doped layers 140a and 140b are over the p-doped layers 130a and 130b, respectively, in accordance with some embodiments. The remaining heavily p-doped layer 150 is over the n-doped layer 140a, in accordance with some embodiments.

The upper portion 122a, the p-doped layer 130a, the n-doped layer 140a, the heavily p-doped layer 150 together form a pillar structure A, in accordance with some embodiments. The upper portion 122b, the p-doped layer 130b, and the n-doped layer 140b together form a pillar structure P, in accordance with some embodiments.

The pillar structures A and P both extend in the same direction B away from the substrate 110, in accordance with some embodiments. The pillar structure P is parallel to the pillar structure A, in accordance with some embodiments. As shown in FIG. 5B, an ion implantation mask layer 510 is formed over a portion of the heavily n-doped layer 120 to cover the pillar structure A, in accordance with some embodiments. The ion implantation mask layer 510 includes silicon nitride or a polymer material, such as a photoresist material, in accordance with some embodiments.

Figure 5C:
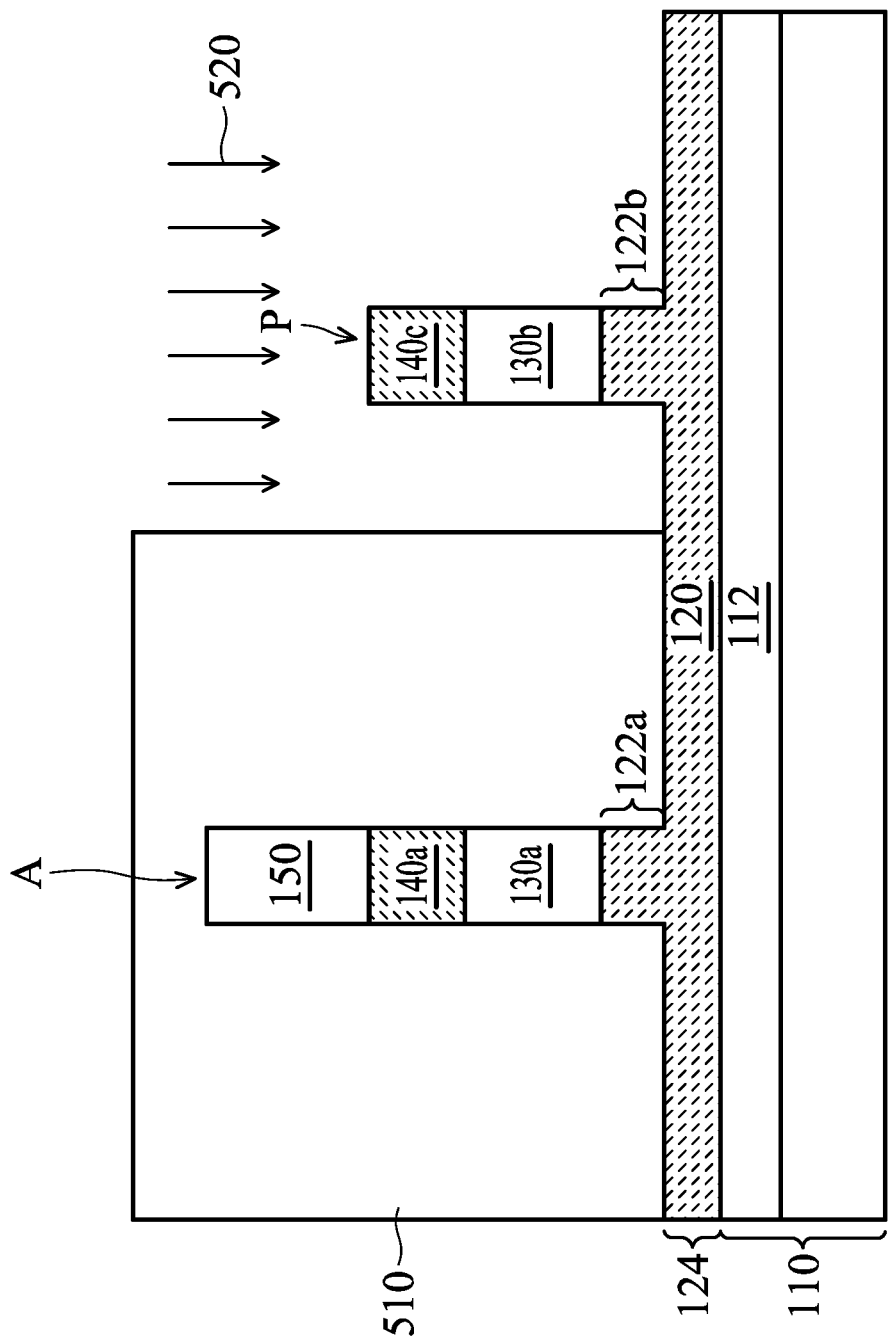

As shown in FIG. 5C, an n-type ion implantation process 520 is performed to increase the concentration of the n-type dopants in the n-doped layer 140b, in accordance with some embodiments. Therefore, after the n-type ion implantation process 520, the n-doped layer 140b becomes a heavily n-doped layer 140c, in accordance with some embodiments.

The concentration of the n-type dopants in the heavily n-doped layer 140c is close to or equal to the concentration of the n-type dopants in the upper portion 122b, in accordance with some embodiments. The pillar structure P includes the heavily n-doped layer 140c, the p-doped layer 130b, and the upper portion 122b, in accordance with some embodiments.

Figure 5D:
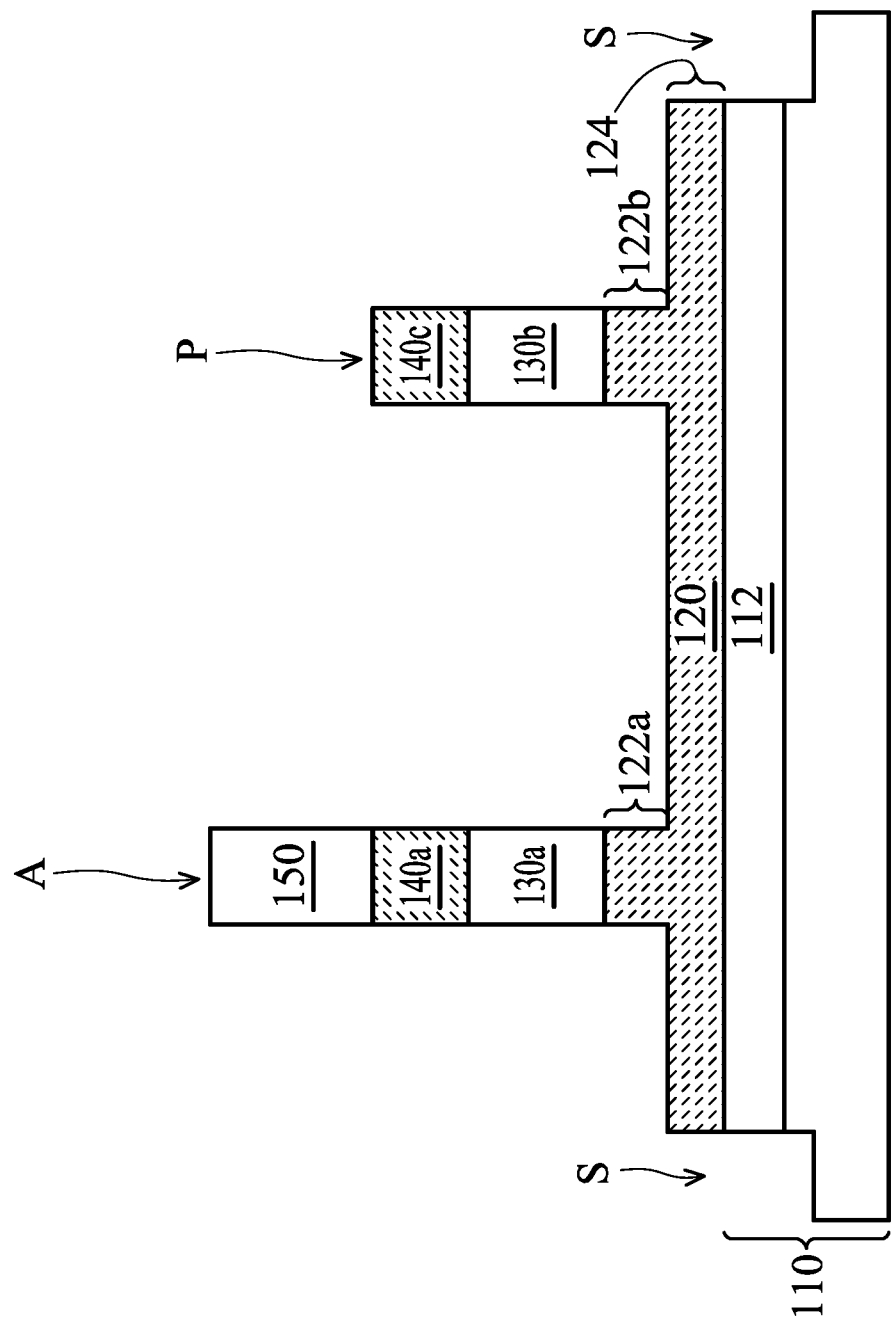

As shown in FIG. 5D, the ion implantation mask layer 510 is removed, in accordance with some embodiments. As shown in FIG. 5D, portions of the substrate 110 and the lower portion 124 of the heavily n-doped layer 120 are removed, in accordance with some embodiments. The removal process forms a trench S in the substrate 110 and the heavily n-doped layer 120, in accordance with some embodiments.

The trench S surrounds the heavily n-doped layer 120 and the p-well 112, in accordance with some embodiments. The trench S is formed using a photolithography process and an etching process, in accordance with some embodiments. The etching process includes a dry etching process, in accordance with some embodiments.

Figure 5E:
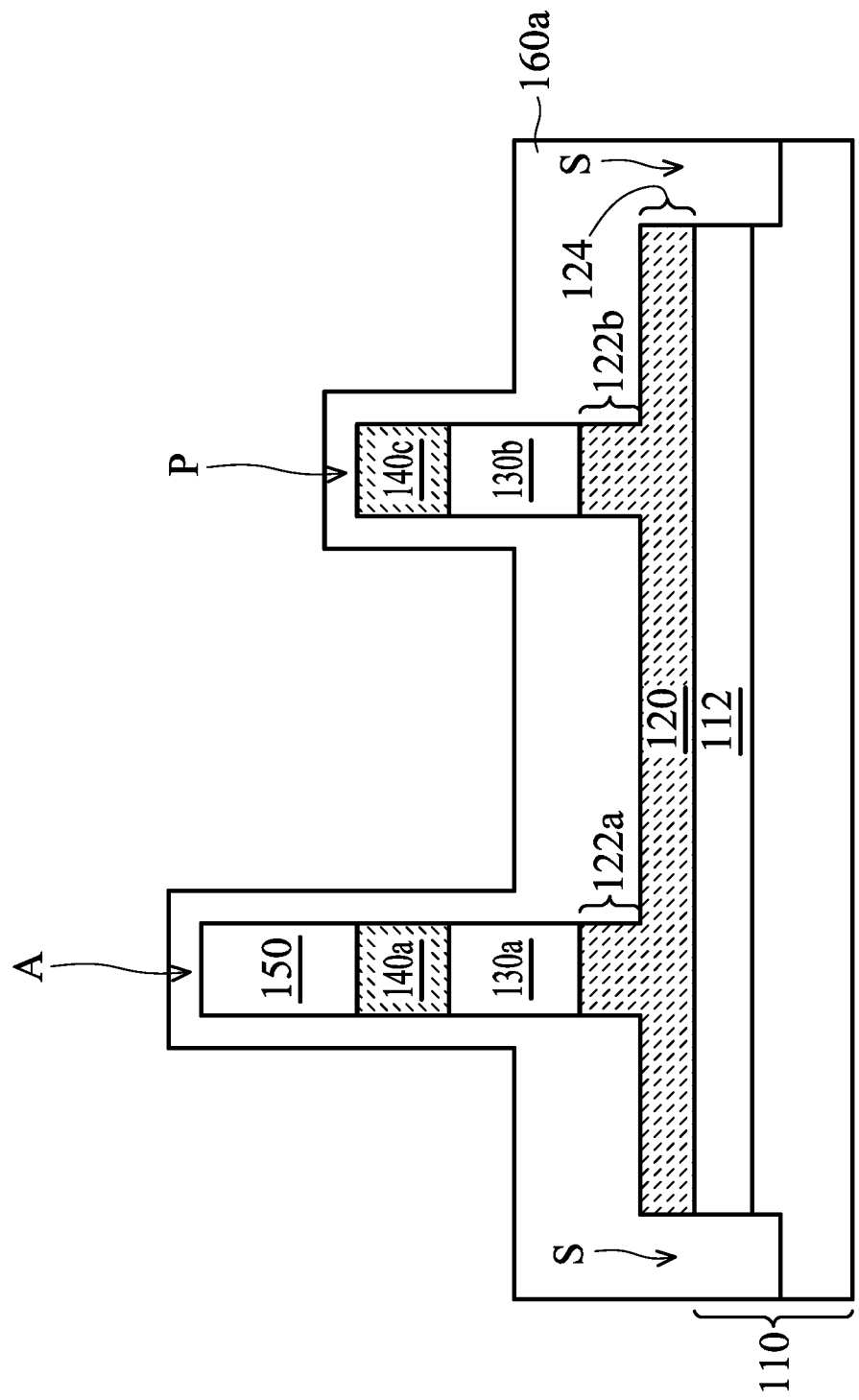

As shown in FIG. 5E, an isolation layer 160a is formed over the substrate 110 to fill the trench S, in accordance with some embodiments. The isolation layer 160a covers the pillar structures A and P and the heavily n-doped layer 120, in accordance with some embodiments. The isolation layer 160a includes a dielectric material, in accordance with some embodiments. The dielectric material includes silicon oxide or another suitable dielectric material. The isolation layer 160a is formed using a spin-on-glass process or another suitable process.

Figure 5F:
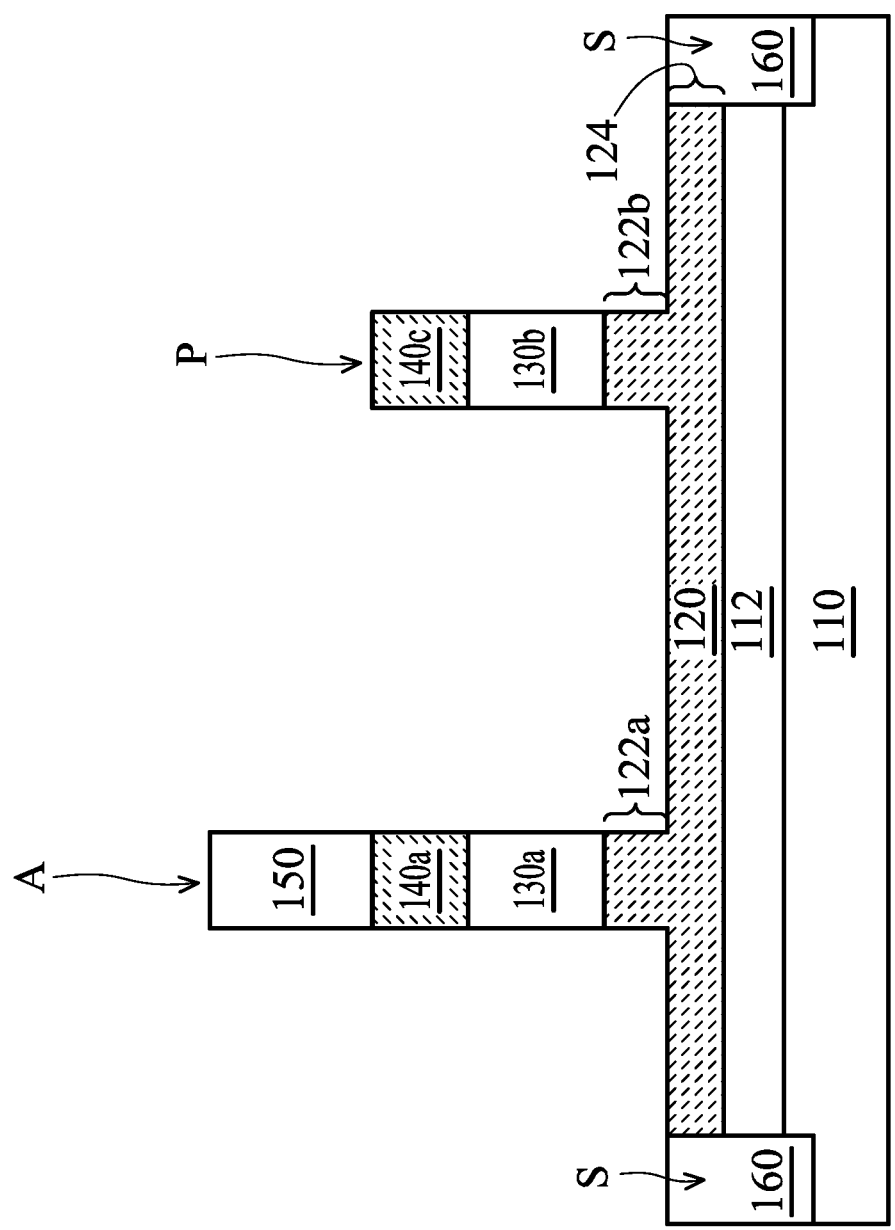

As shown in FIG. 5F, the isolation layer 160a outside of the trench S is removed, in accordance with some embodiments. The remaining isolation layer 160a forms an isolation structure 160, in accordance with some embodiments. The isolation structure 160 surrounds the heavily n-doped layer 120, the pillar structures A and P, and the p-well 112, in accordance with some embodiments.

Figure 5G:
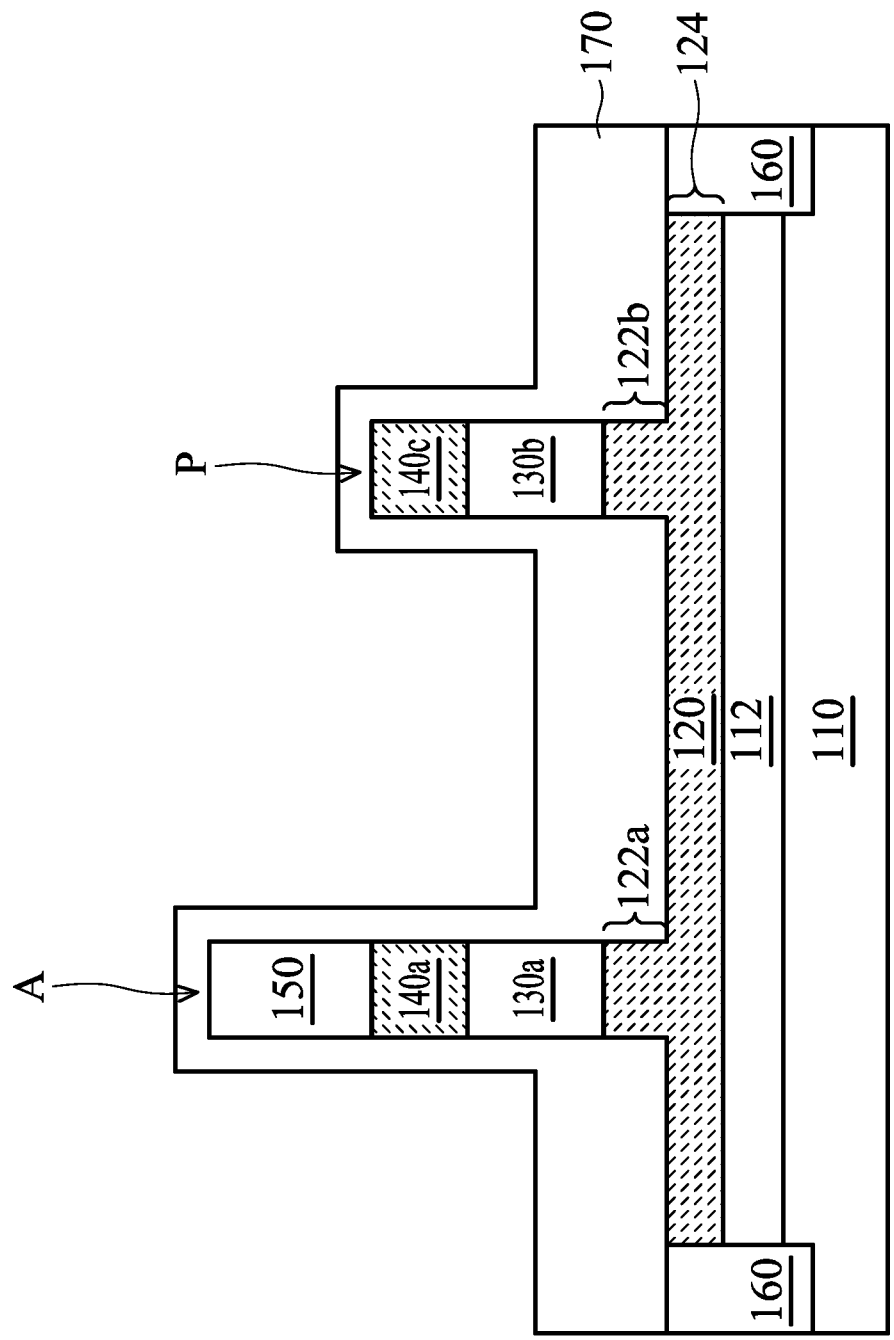

As shown in FIG. 5G, a dielectric layer 170 is formed over the isolation structure 160, the heavily n-doped layer 120, and the pillar structures A and P, in accordance with some embodiments. The dielectric layer 170 over the pillar structures A and P is thinner than the dielectric layer 170 over the isolation structure 160 and the lower portion 124 of the heavily n-doped layer 120, in accordance with some embodiments. The dielectric layer 170 includes silicon oxide or another suitable dielectric material. The dielectric layer 170 is formed using a spin-on-glass process or another suitable process.

Figure 5H:
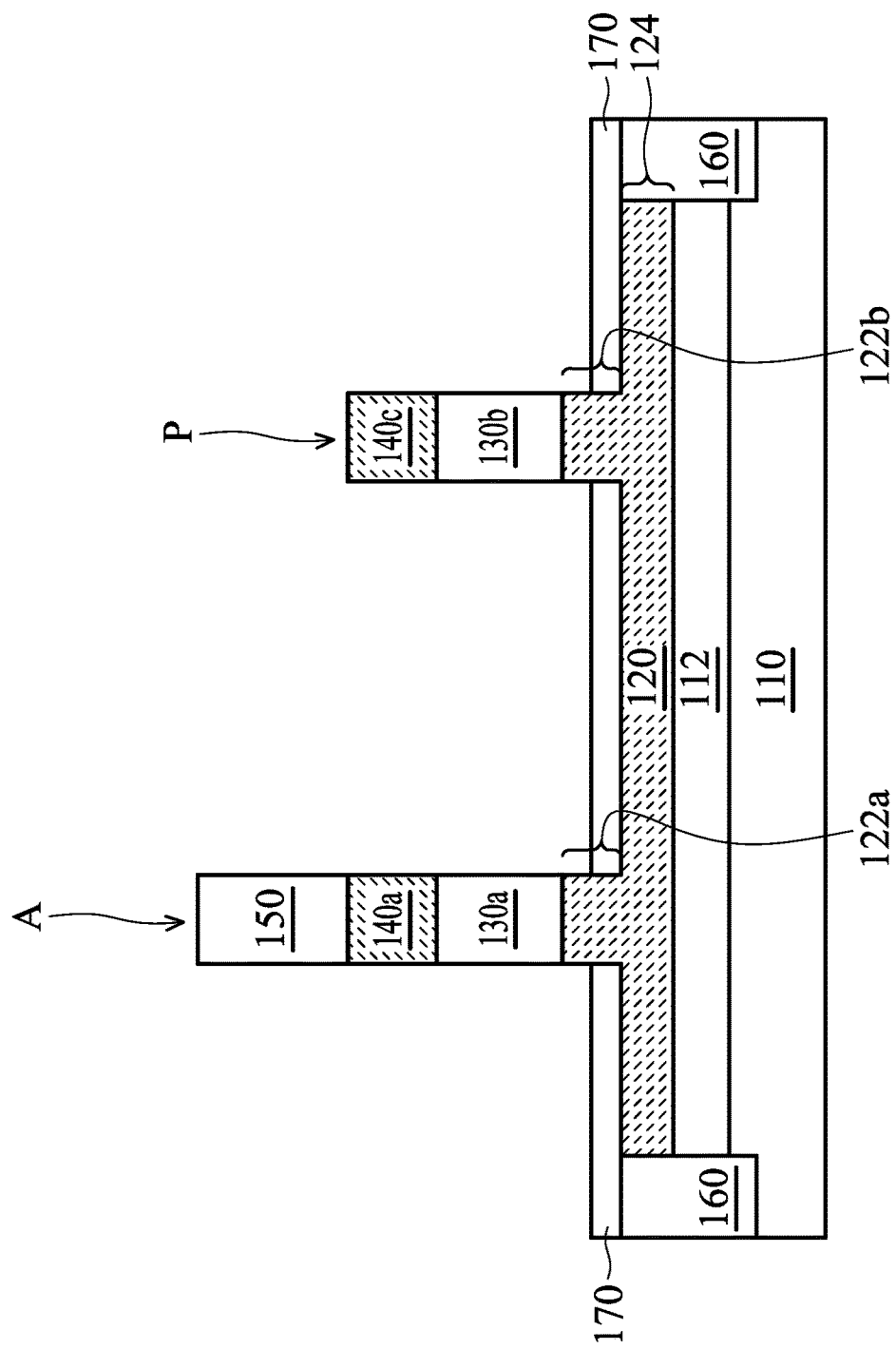

As shown in FIG. 5H, the dielectric layer 170 is thinned, in accordance with some embodiments. After the thinning process, the dielectric layer 170 exposes the p-doped layers 130a and 130b, the n-doped layer 140a, the heavily n-doped layer 140c, the heavily p-doped layer 150, and portions of the upper portions 122a and 122b, in accordance with some embodiments. The thinning process includes a wet etching process, in accordance with some embodiments.

Figure 5I:
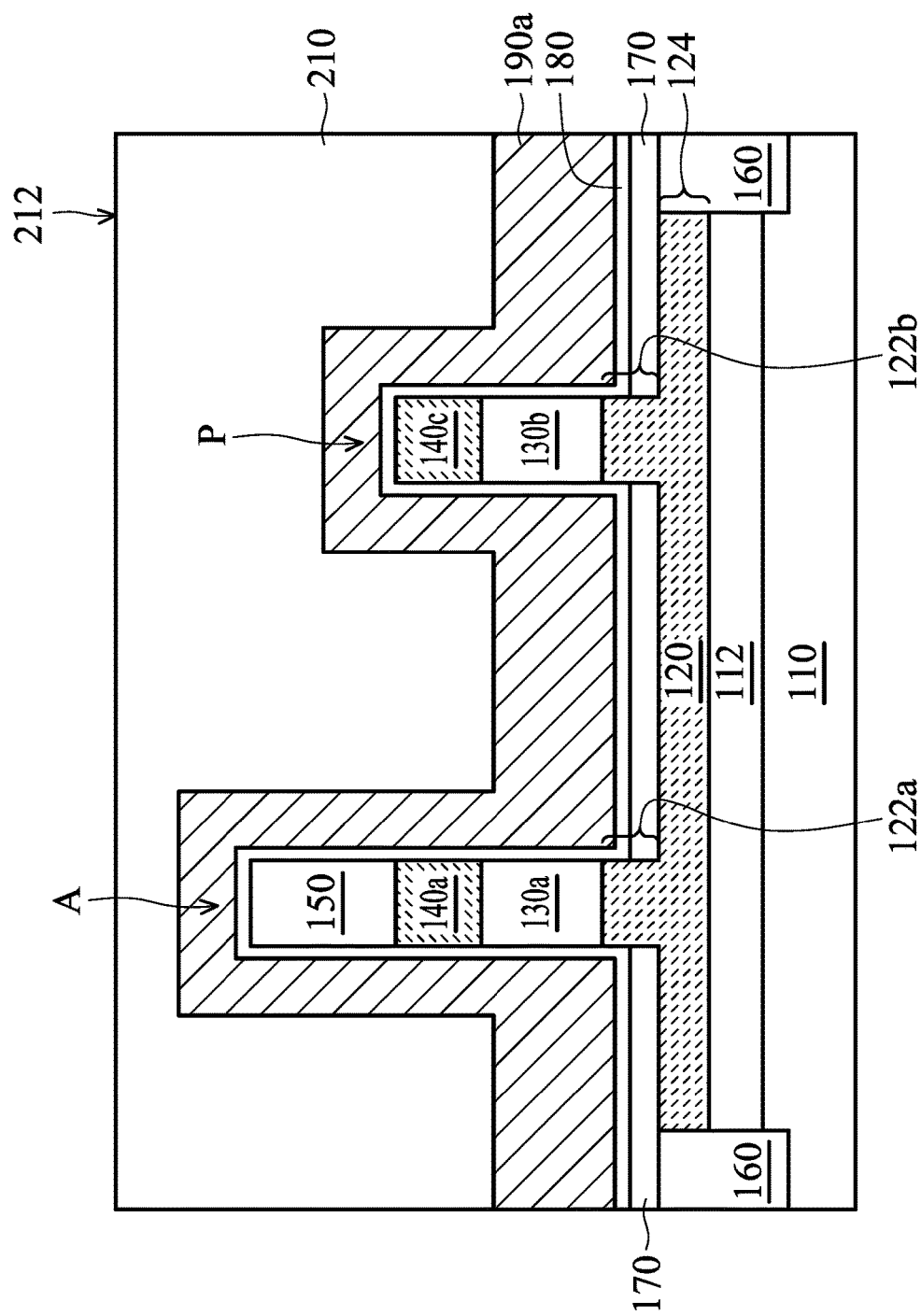

As shown in FIG. 5I, a gate dielectric layer 180 is formed over the dielectric layer 170 and the pillar structures A and P, in accordance with some embodiments. As shown in FIG. 5I, a gate material layer 190a is formed over the gate dielectric layer 180, in accordance with some embodiments. As shown in FIG. 5I, a dielectric layer 210 is formed over the gate material layer 190a, in accordance with some embodiments. The dielectric layer 210 has a substantially planar top surface 212, in accordance with some embodiments.

Figure 5J:
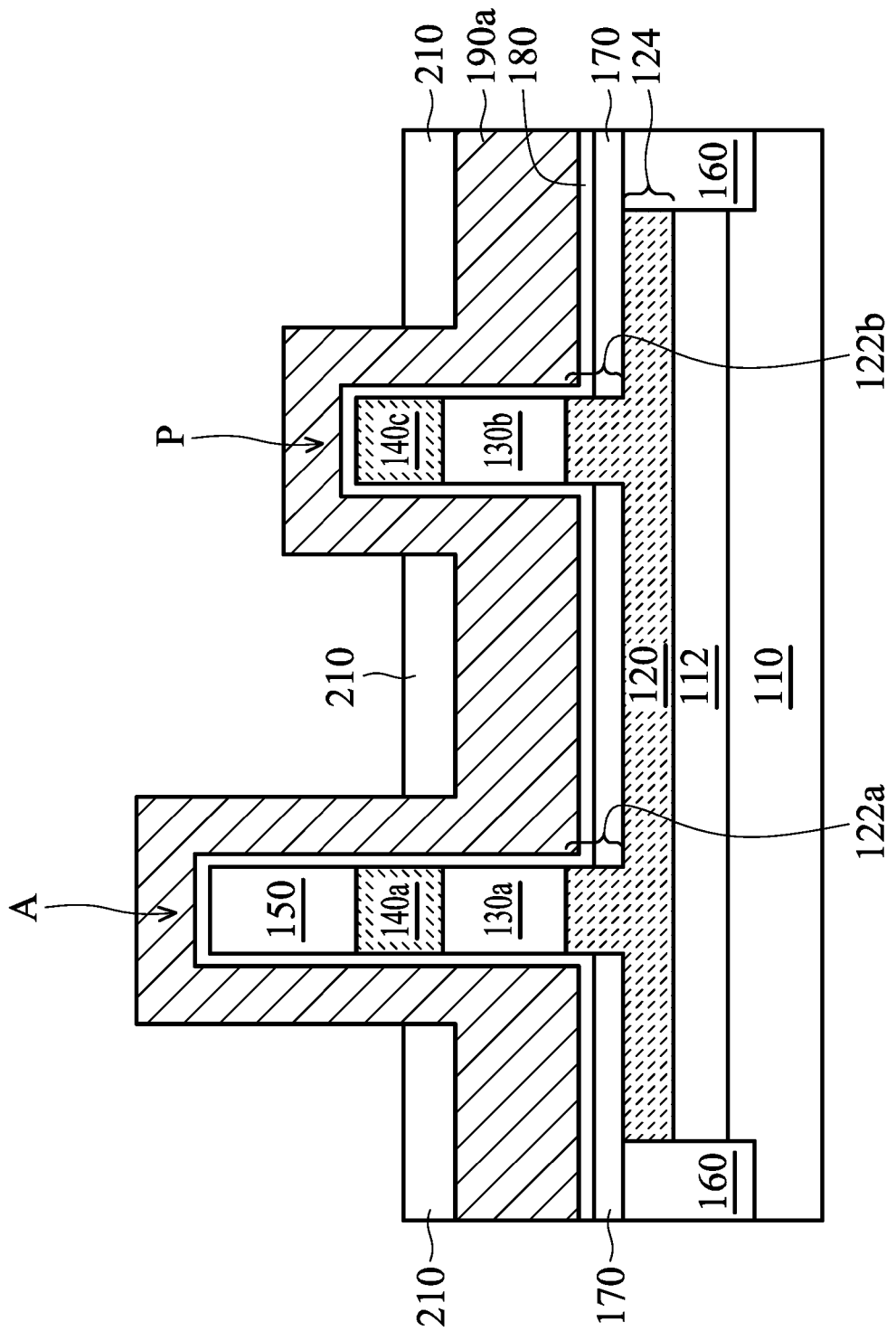

As shown in FIG. 5J, an upper portion of the dielectric layer 210 is removed, in accordance with some embodiments. The remaining dielectric layer 210 exposes an upper portion of the gate material layer 190a, in accordance with some embodiments. The removal process includes a wet etching process or another suitable etching process.

Figure 5K:
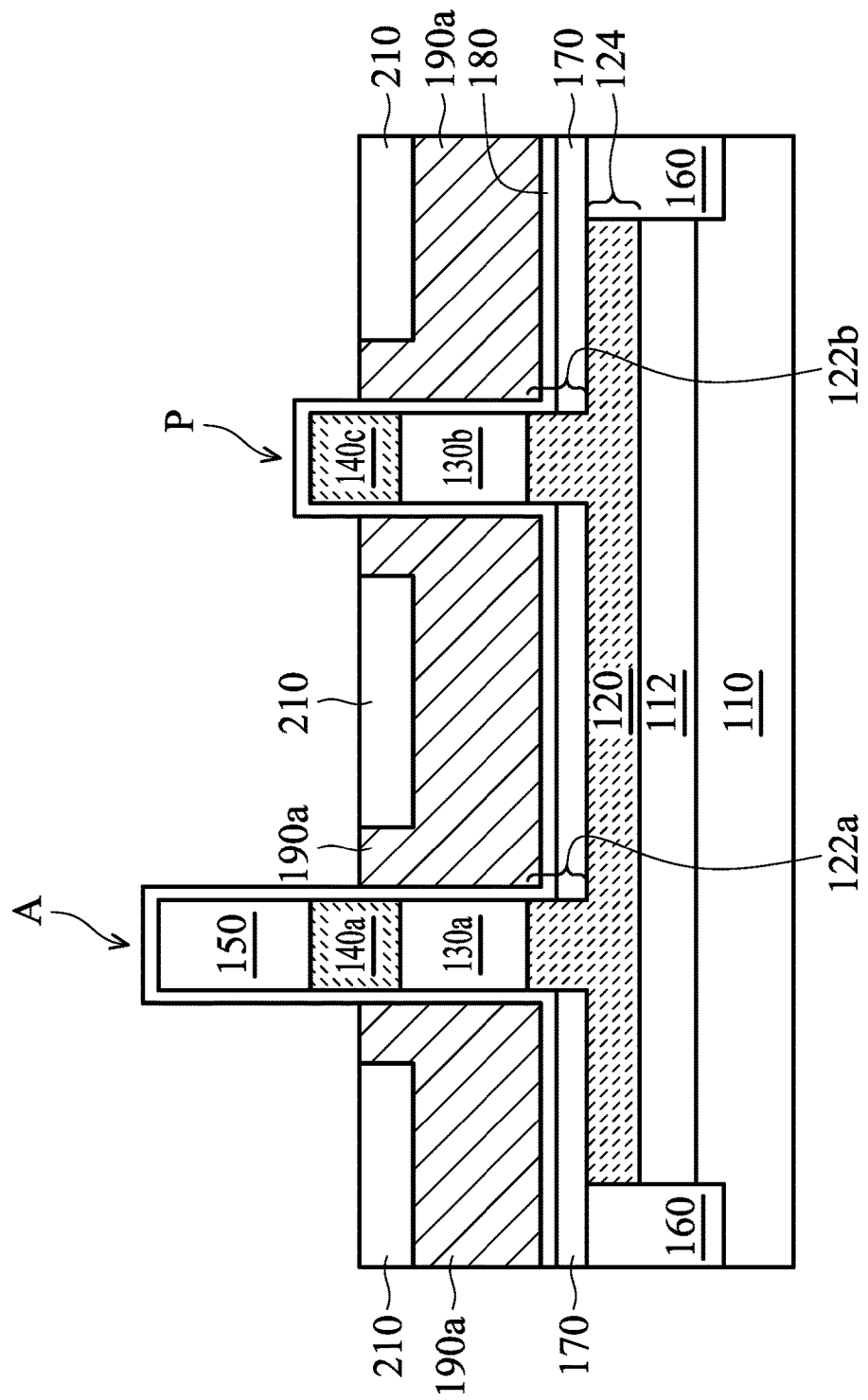

As shown in FIG. 5K, the upper portion of the gate material layer 190a is removed, in accordance with some embodiments. The remaining gate material layer 190a exposes an upper portion of the gate dielectric layer 180, in accordance with some embodiments. The removal process includes a wet etching process or a dry etching process, in accordance with some embodiments.

Figure 5L:
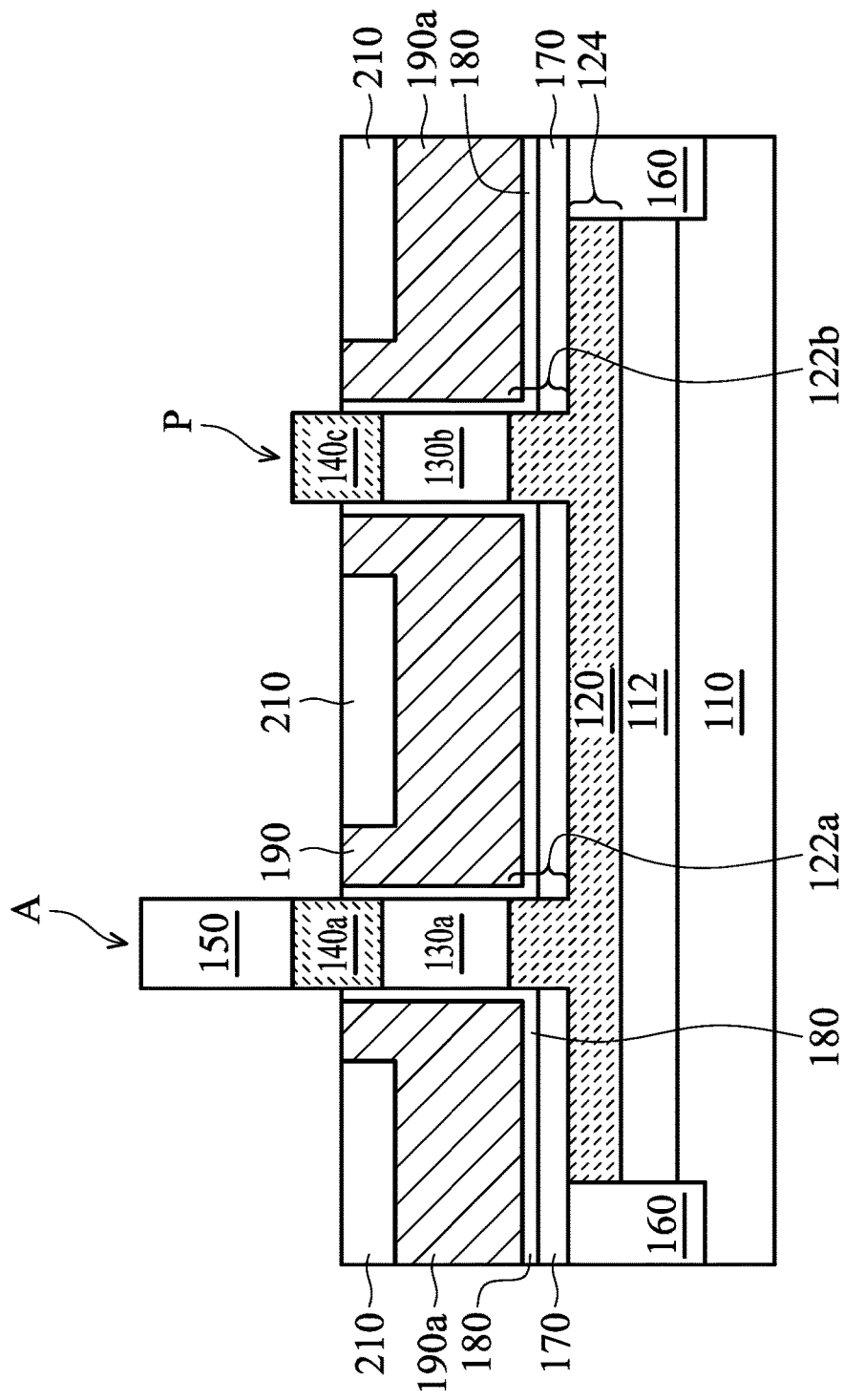

As shown in FIG. 5L, the upper portion of the gate dielectric layer 180 is removed, in accordance with some embodiments. The remaining gate dielectric layer 180 exposes the heavily p-doped layer 150 and upper portions of the n-doped layer 140a and the heavily n-doped layer 140c, in accordance with some embodiments. The removal process includes a wet etching process or a dry etching process, in accordance with some embodiments.

Figure 5M:
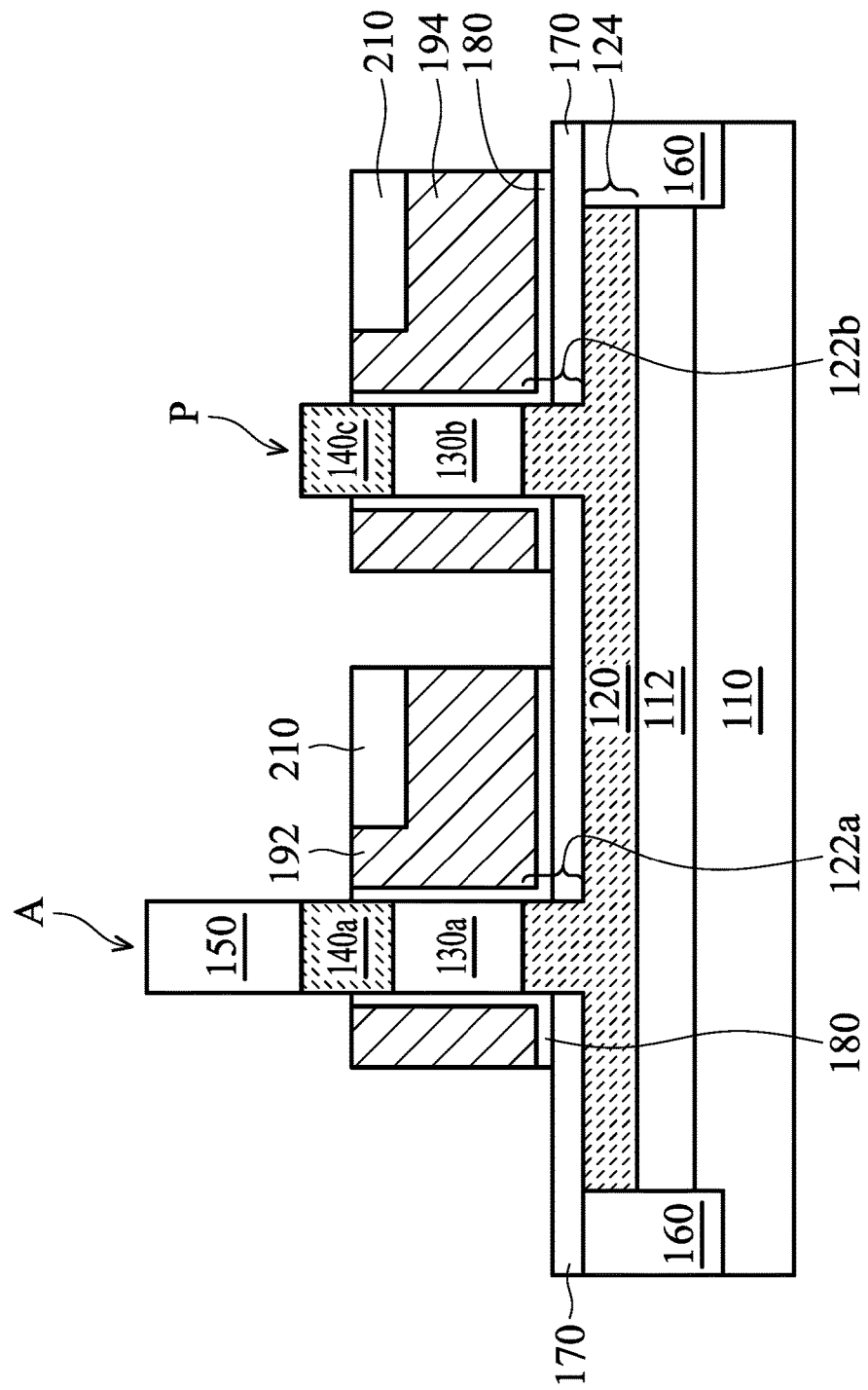
Figure 5N:
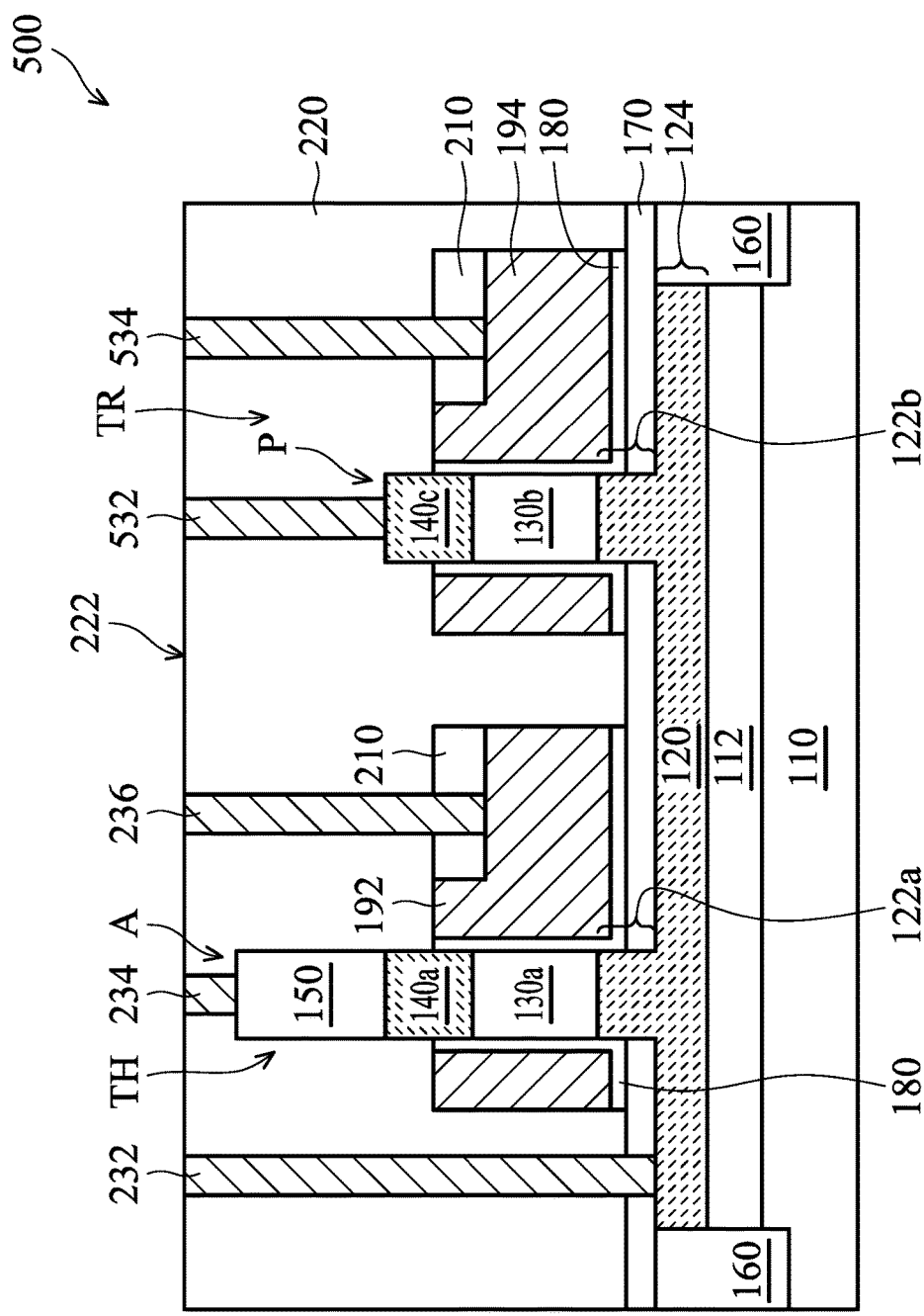
Figures 1, 5N:
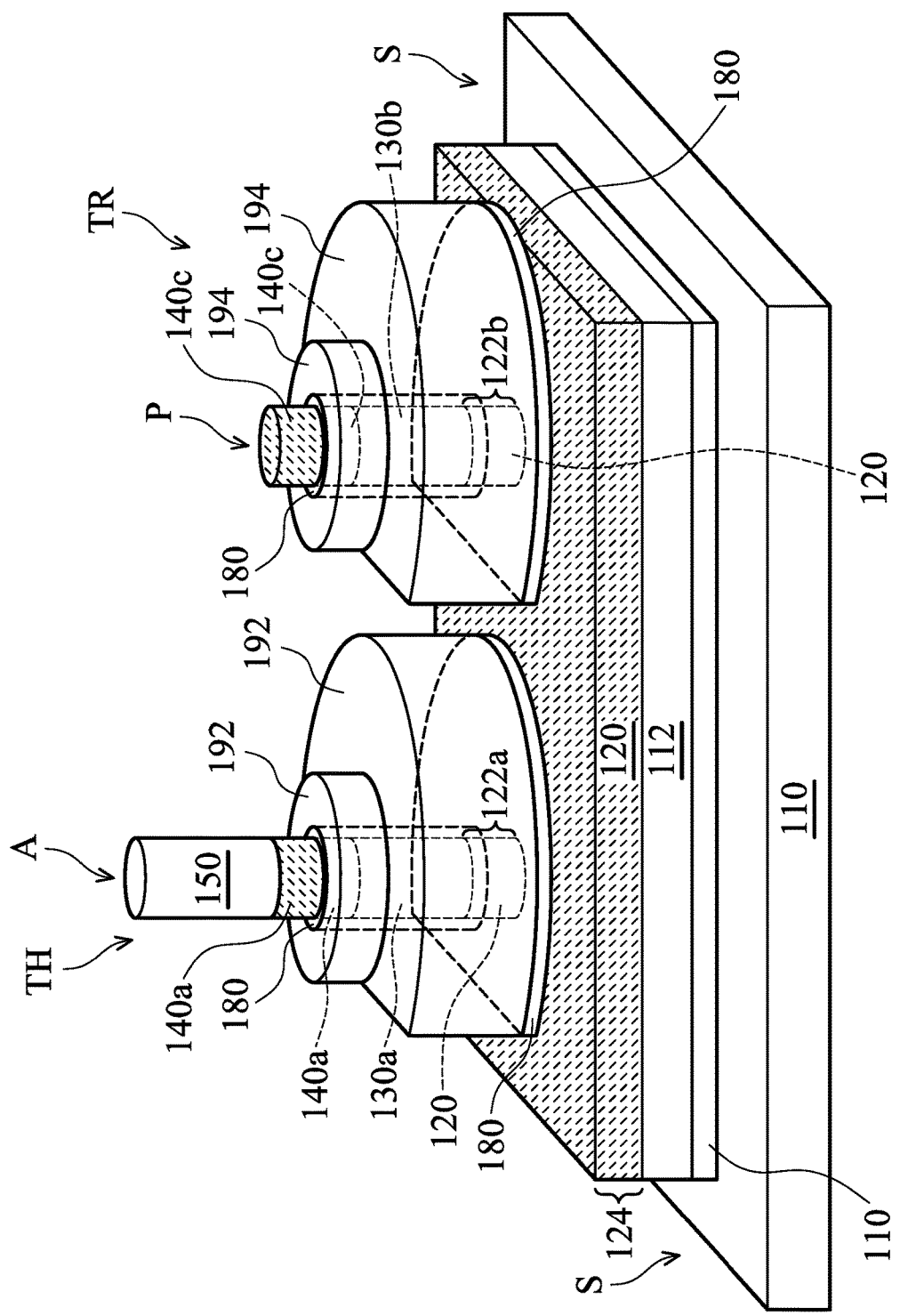

As shown in FIG. 5M, a patterning process is performed to remove portions of the dielectric layer 210, the gate material layer 190a, and the gate dielectric layer 180, in accordance with some embodiments. The remaining gate material layer 190a forms gate electrodes 192 and 194, in accordance with some embodiments. The patterning process includes a photolithography process and one or more etching processes, in accordance with some embodiments.

As shown in FIG. 5N, a dielectric layer 220 is formed over the pillar structures A and P, the dielectric layers 210 and 170, the gate electrodes 192 and 194, and the gate dielectric layer 180, in accordance with some embodiments. The dielectric layer 220 has a substantially planar top surface 222, in accordance with some embodiments.

As shown in FIG. 5N, contact structures 232, 234, 236, 532, and 534 are formed in the dielectric layers 210 and 220, in accordance with some embodiments. The contact structures 232, 234, 236, 532, and 534 are electrically connected to the heavily n-doped layer 120, the heavily p-doped layer 150, the gate electrode 192, the heavily n-doped layer 140c, and the gate electrode 194, respectively, in accordance with some embodiments. The contact structure 232 passes through the dielectric layers 170 and 220, in accordance with some embodiments. The contact structures 236 and 534 pass through the dielectric layers 210 and 220, in accordance with some embodiments.

FIG. 5N-1 is a perspective view of the semiconductor device structure 500 of FIG. 5N, in accordance with some embodiments. For the sake of simplicity, the isolation structure 160, the dielectric layers 170, 210, and 220, and the contact structures 232, 234, 236, 532, and 534 are omitted, in accordance with some embodiments.

As shown in FIGS. 5N and 5N-1, the gate electrode 192 and the gate dielectric layer 180 thereunder horizontally and continuously surround the pillar structure A, in accordance with some embodiments. The gate electrode 192 and the gate dielectric layer 180 thereunder horizontally and continuously surround the p-doped layer 130a, in accordance with some embodiments. The gate electrode 192 and the pillar structure A together form a thyristor TH, in accordance with some embodiments.

The gate electrode 194 and the gate dielectric layer 180 thereunder horizontally and continuously surround the pillar structure P, in accordance with some embodiments. The gate electrode 194 and the gate dielectric layer 180 thereunder horizontally and continuously surround the p-doped layer 130b, in accordance with some embodiments. The gate electrode 194 and the pillar structure P together form a transistor TR, in accordance with some embodiments. The upper portions 122a and 122b and the lower portion 124 are electrically connected with each other, in accordance with some embodiments.

The heavily n-doped layer 120, the p-doped layer 130a, the n-doped layer 140a, and the heavily p-doped layer 150 are sequentially stacked together, in accordance with some embodiments. The heavily n-doped layer 120, the p-doped layer 130a, the n-doped layer 140a, and the heavily p-doped layer 150 are sequentially stacked over the substrate 110, in accordance with some embodiments. The heavily n-doped layer 120, the p-doped layer 130a, the n-doped layer 140a, and the heavily p-doped layer 150 are sequentially connected in series, in accordance with some embodiments.

The upper portion 122b of the heavily n-doped layer 120, the p-doped layer 130b, and the heavily n-doped layer 140c are sequentially stacked together, in accordance with some embodiments. The upper portion 122b, the p-doped layer 130b, and the heavily n-doped layer 140c are sequentially stacked over the substrate 110, in accordance with some embodiments. The upper portion 122b, the p-doped layer 130b, and the heavily n-doped layer 140c are sequentially connected in series, in accordance with some embodiments.

The lower portion 124 of the heavily n-doped layer 120 is wider than the pillar structure A or P, in accordance with some embodiments. The gate dielectric layer 180 is between the gate electrode 192 and the p-doped layer 130a and between the gate electrode 192 and the lower portion 124 of the heavily n-doped layer 120, in accordance with some embodiments. The gate dielectric layer 180 is between the gate electrode 194 and the p-doped layer 130b and between the gate electrode 194 and the lower portion 124, in accordance with some embodiments. The semiconductor device structure 500 of FIG. 5N includes a thyristor RAM cell, in accordance with some embodiments.

Figure 6:
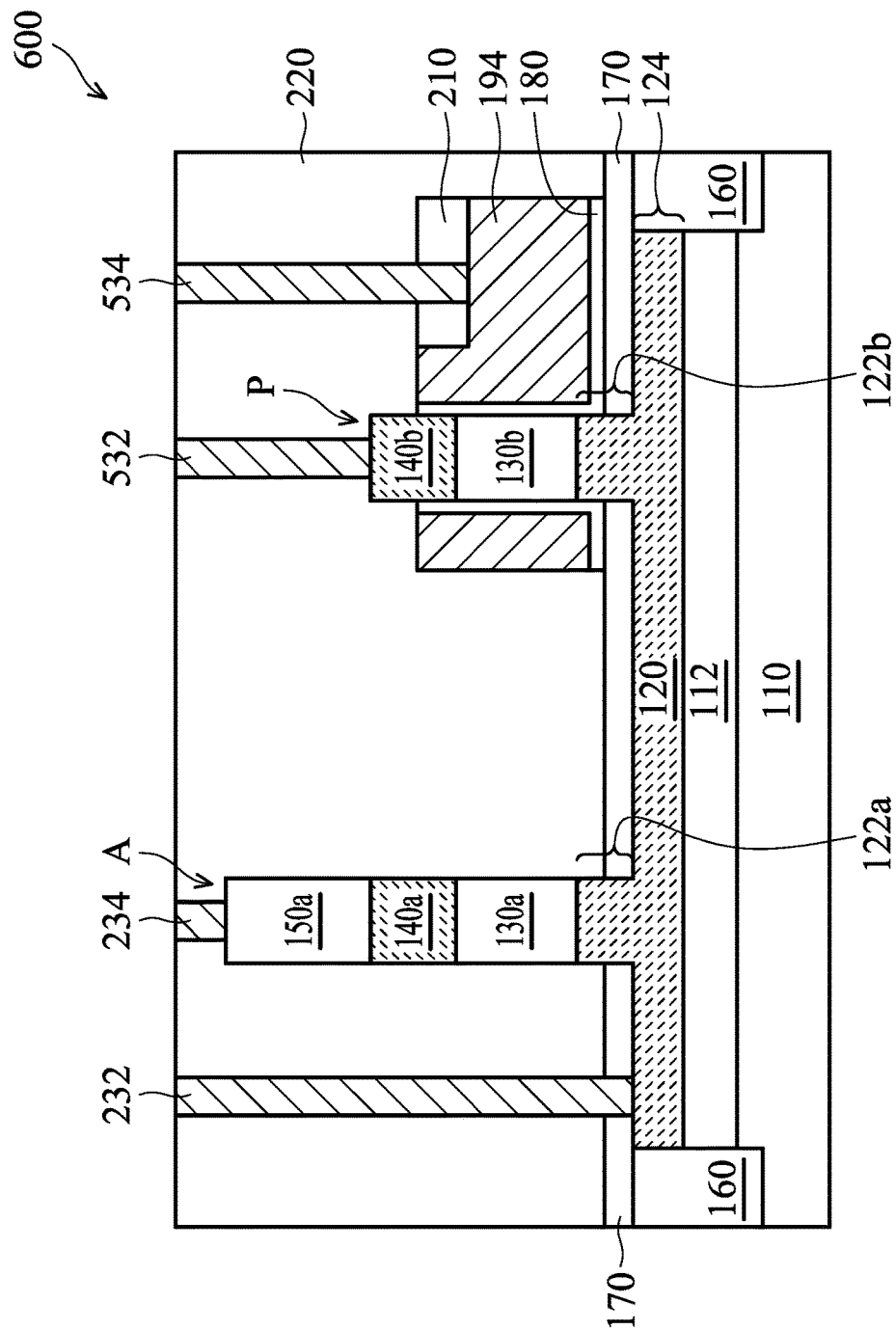
FIG. 6 is a variation of the semiconductor device structure of FIG. 5N, in accordance with some embodiments.

In some other embodiments, as shown in FIG. 6, the gate electrode 192, the gate dielectric layer 180 thereunder, the dielectric layer 210 thereon, and the contact structure 236 are not formed. The semiconductor device structure 600 of FIG. 6 includes a Shockley diode RAM cell, in accordance with some embodiments.

Figure 7:
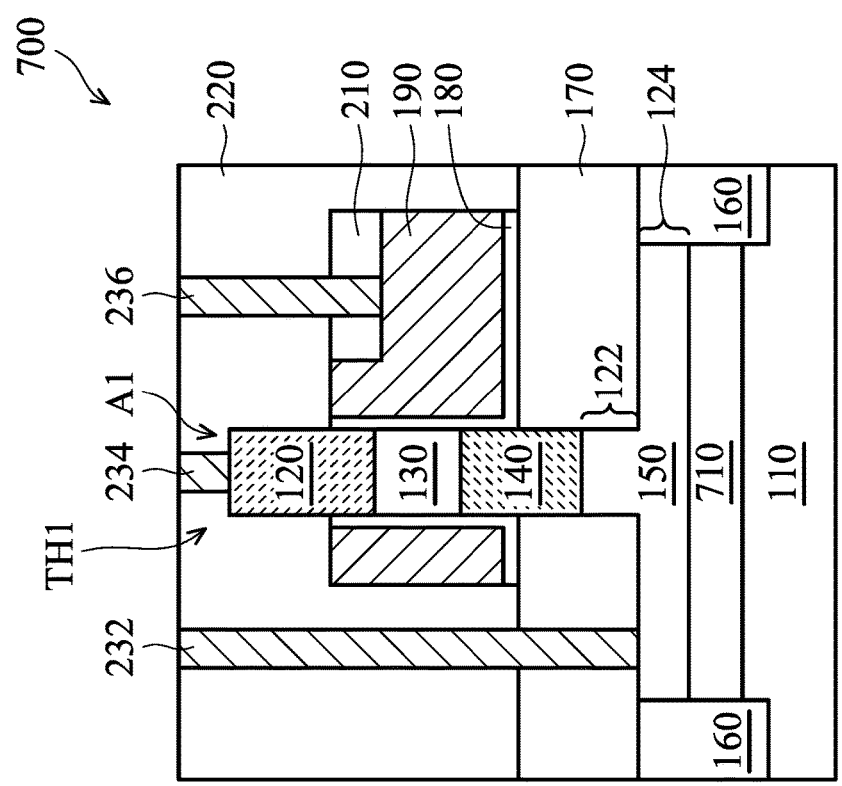
FIG. 7 is a variation of the semiconductor device structure of FIG. 1P, in accordance with some embodiments.

In some embodiments, the formation sequence of the heavily n-doped layer 120, the p-doped layer 130, the n-doped layer 140, and the heavily p-doped layer 150 is changed, in accordance with some embodiments. FIG. 7 is a variation of the semiconductor device structure 100 of FIG. 1P, in accordance with some embodiments.

As shown in FIG. 7, the semiconductor device structure 700 is similar to the semiconductor device structure 100 of FIG. 1P, except that compared to the semiconductor device structure 100, the formation sequence of the heavily n-doped layer 120, the p-doped layer 130, the n-doped layer 140, and the heavily p-doped layer 150 of the semiconductor device structure 700 is reversed.

In some embodiments, an n-well 710 is formed in the upper portion of the substrate 110. The heavily p-doped layer 150, the n-doped layer 140, the p-doped layer 130, and the heavily n-doped layer 120 are sequentially stacked over the n-well 710, in accordance with some embodiments.

The pillar structure A1 of the semiconductor device structure 700 includes the heavily n-doped layer 120, the p-doped layer 130, the n-doped layer 140, and an upper portion 152 of the heavily p-doped layer 150, in accordance with some embodiments. The dielectric layer 170 is thicker than the upper portion 152, in accordance with some embodiments. The pillar structure A1 and the gate electrode 190 together form a thyristor TH1, in accordance with some embodiments.

Figure 8:
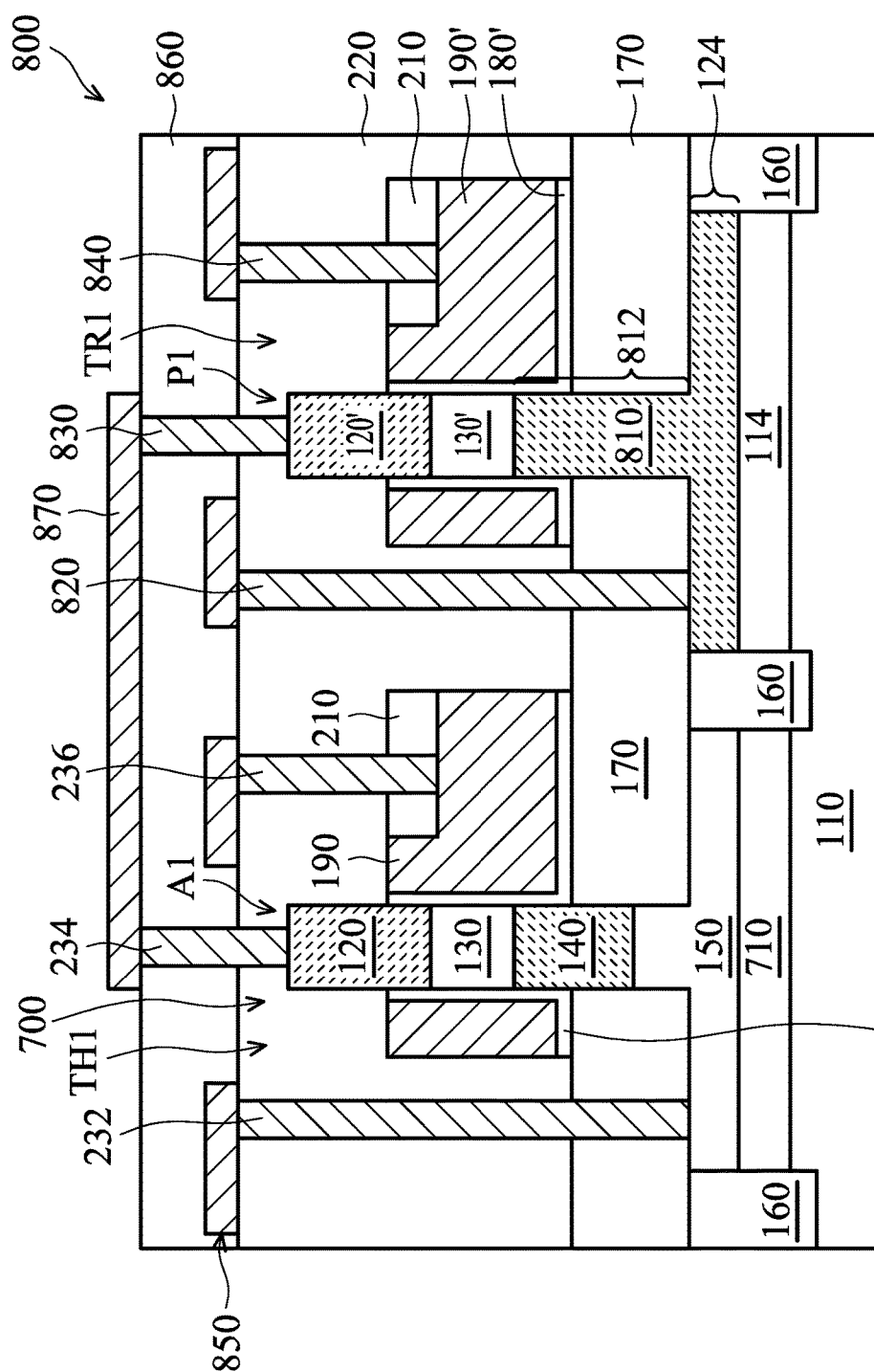
FIG. 8 is a variation of the semiconductor device structure of FIG. 7, in accordance with some embodiments.

FIG. 8 is a variation of the semiconductor device structure 700 of FIG. 7, in accordance with some embodiments. As shown in FIG. 8, the semiconductor device structure 800 includes the semiconductor device structure 700 of FIG. 7 and a transistor TR1, in accordance with some embodiments. In some embodiments, a p-well 114 is formed in the substrate 110. A heavily n-doped layer 810, a p-doped layer 130', and a heavily n-doped layer 120' are sequentially stacked over the p-well 114, in accordance with some embodiments.

The transistor TR1 includes a pillar structure P1 and a gate electrode 190', in accordance with some embodiments. The pillar structure TR1 includes the heavily n-doped layer 120', the p-doped layer 130', and an upper portion 812 of the heavily n-doped layer 810, in accordance with some embodiments. The gate electrode 190' horizontally and continuously surrounds the p-doped layer 130', in accordance with some embodiments. The transistor TR1 includes a gate dielectric layer 180' between the gate electrode 190' and the p-doped layer 130', in accordance with some embodiments.

The isolation structure 160 separates the n-well 710 and the heavily p-doped layer 150 from the p-well 114 and the heavily n-doped layer 810, in accordance with some embodiments. The heavily n-doped layer 120', the p-doped layer 130', and the gate electrode 190' are formed in the processes for forming the heavily n-doped layer 120, the p-doped layer 130, and the gate electrode 190, respectively, in accordance with some embodiments. Therefore, materials of the heavily n-doped layer 120', the p-doped layer 130', and the gate electrode 190' are the same as materials of the heavily n-doped layer 120, the p-doped layer 130, and the gate electrode 190, respectively, in accordance with some embodiments.

The semiconductor device structure 800 further includes contact structures 820, 830, and 840, a wiring layer 850, a dielectric layer 860, and a conductive line 870, in accordance with some embodiments. The wiring layer 850 is formed over the dielectric layer 220, in accordance with some embodiments.

The contact structure 820 passes through the dielectric layers 170 and 220 to electrically connect the heavily n-doped layer 810 to the wiring layer 850, in accordance with some embodiments. The contact structure 840 passes through the dielectric layers 210 and 220 to electrically connect the gate electrode 190' to the wiring layer 850, in accordance with some embodiments.

The dielectric layer 860 is formed over the dielectric layer 220 and the wiring layer 850, in accordance with some embodiments. The conductive line 870 is formed over the dielectric layer 860, in accordance with some embodiments. The contact structure 234 passes through the dielectric layers 860 and 220 to electrically connect the heavily n-doped layer 120 to the conductive line 870, in accordance with some embodiments.

The contact structure 830 passes through the dielectric layers 860 and 220 to electrically connect the heavily n-doped layer 120' to the conductive line 870, in accordance with some embodiments. The heavily n-doped layers 120 and 120' are electrically connected with each other, in accordance with some embodiments.

Figure 9A:
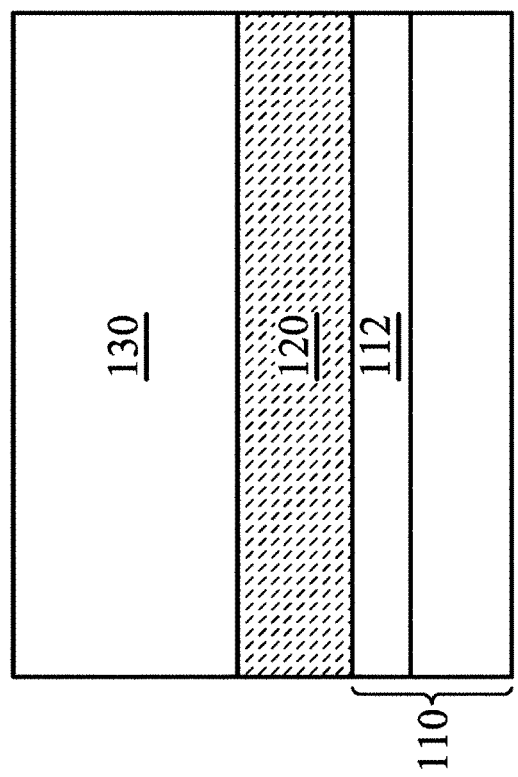
FIGS. 9A-9H are cross-sectional views of various stages of a process for forming a semiconductor device structure, in accordance with some embodiments.

FIGS. 9A-9H are cross-sectional views of various stages of a process for forming a semiconductor device structure 900, in accordance with some embodiments. As shown in FIG. 9A, the formation of the p-well 112 in the substrate 110 and the formation of the heavily n-doped layer 120 and the p-doped layer 130 of FIG. 1A are performed, in accordance with some embodiments.

Figure 9B:
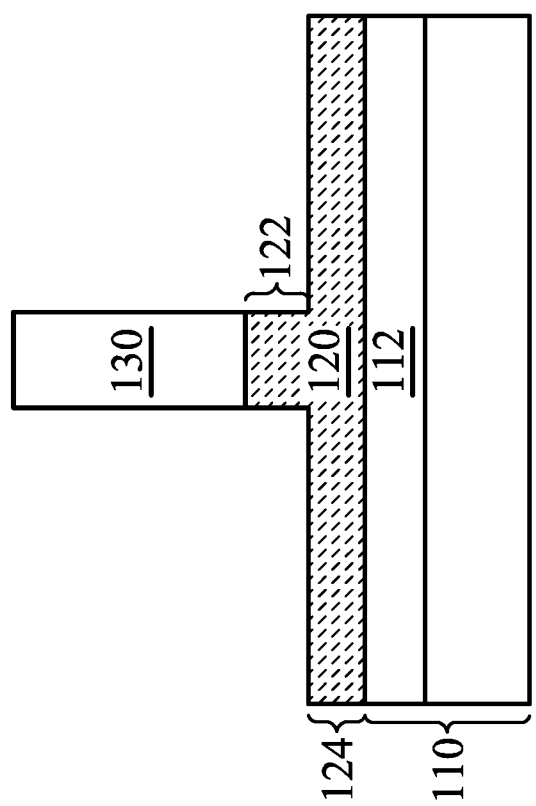

As shown in FIG. 9B, portions of the heavily n-doped layer 120 and the p-doped layer 130 are removed, in accordance with some embodiments. The removal process includes a dry etching process, in accordance with some embodiments. The heavily n-doped layer 120 has an upper portion 122 and a lower portion 124, in accordance with some embodiments. The lower portion 124 is wider than the upper portion 122, in accordance with some embodiments.

Figure 9C:
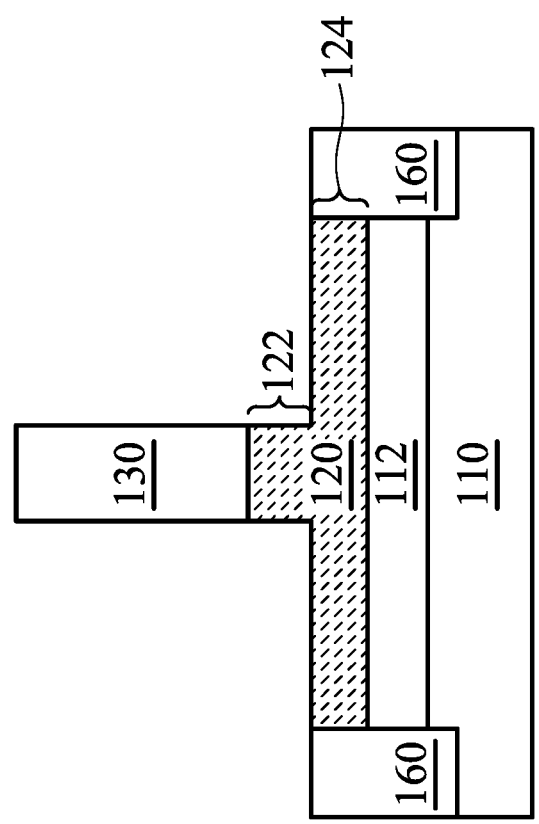
Figure 9D:
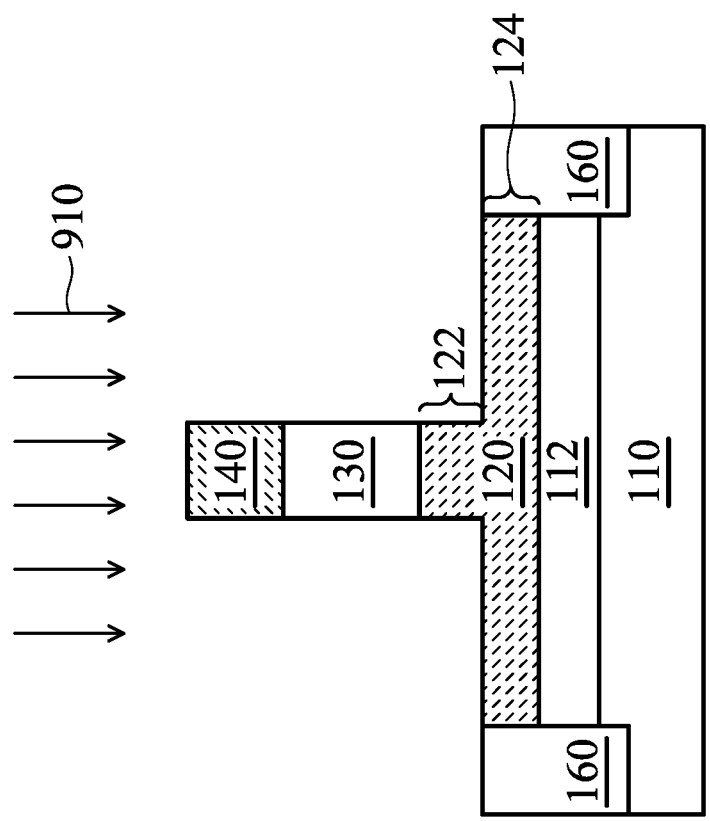

As shown in FIG. 9C, the steps of FIGS. 1C-1E are performed to form isolation structure 160 in the heavily n-doped layer 120 and the semiconductor substrate 110, in accordance with some embodiments. The isolation structure 160 surrounds the heavily n-doped layer 120 and the p-well 112, in accordance with some embodiments. As shown in FIG. 9D, an n-type ion implantation process 910 is performed on the p-doped layer 130 to transform the upper portion of the p-doped layer 130 into an n-doped layer 140, in accordance with some embodiments.

Figure 9E:
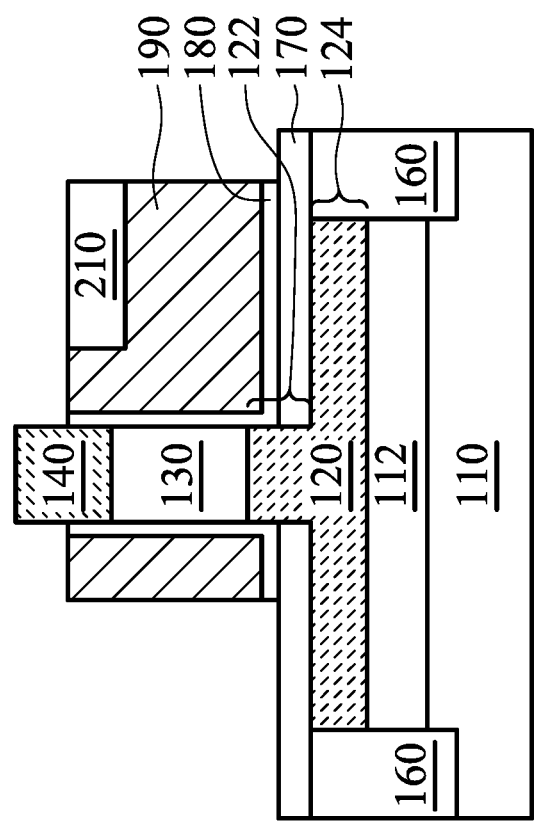

As shown in FIG. 9E, the steps of FIGS. 1F-1L are performed to form a dielectric layer 170, a gate dielectric layer 180, a gate electrode 190, and a dielectric layers 210 over the substrate 110, in accordance with some embodiments. The dielectric layer 170 is formed over the isolation structure 160 and the heavily n-doped layer 120, in accordance with some embodiments.

The gate dielectric layer 180 is formed over the dielectric layer 170 and sidewalls of the heavily n-doped layer 120, the p-doped layer 130, and the n-doped layer 140, in accordance with some embodiments. The gate electrode 190 is formed over the gate dielectric layer 180, in accordance with some embodiments. The dielectric layer 210 is formed over the gate electrode 190, in accordance with some embodiments.

Figure 9F:
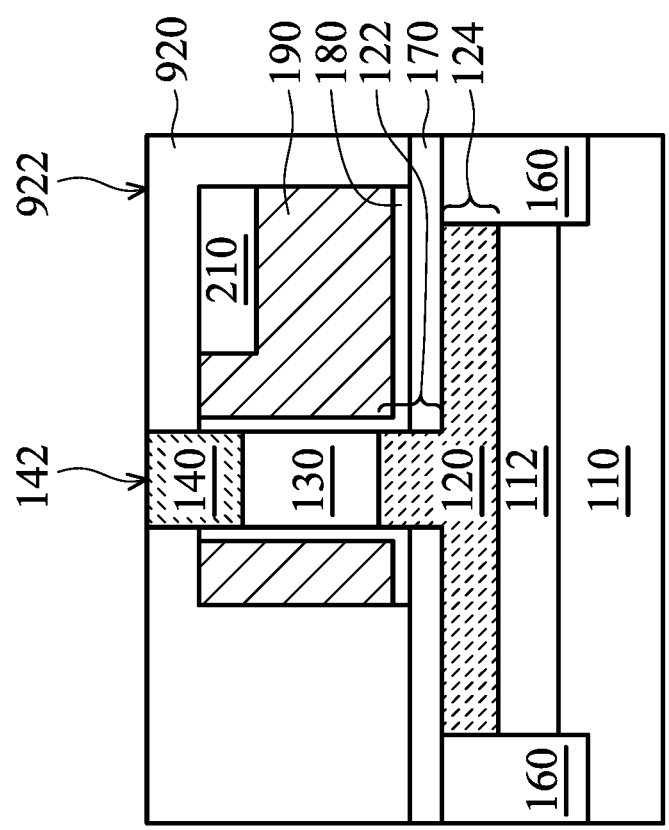

As shown in FIG. 9F, a dielectric layer 920 is formed over the substrate 110, in accordance with some embodiments. The dielectric layer 920 covers the dielectric layers 170 and 210, the gate electrode 190, and the gate dielectric layer 180, in accordance with some embodiments.

The dielectric layer 920 surrounds the upper portion 122, the p-doped layer 130, and the n-doped layer 140, in accordance with some embodiments. The dielectric layer 920 exposes a top surface 142 of the n-doped layer 140, in accordance with some embodiments. The top surface 142 is aligned with a top surface 922 of the dielectric layer 920, in accordance with some embodiments.

Figure 9G:
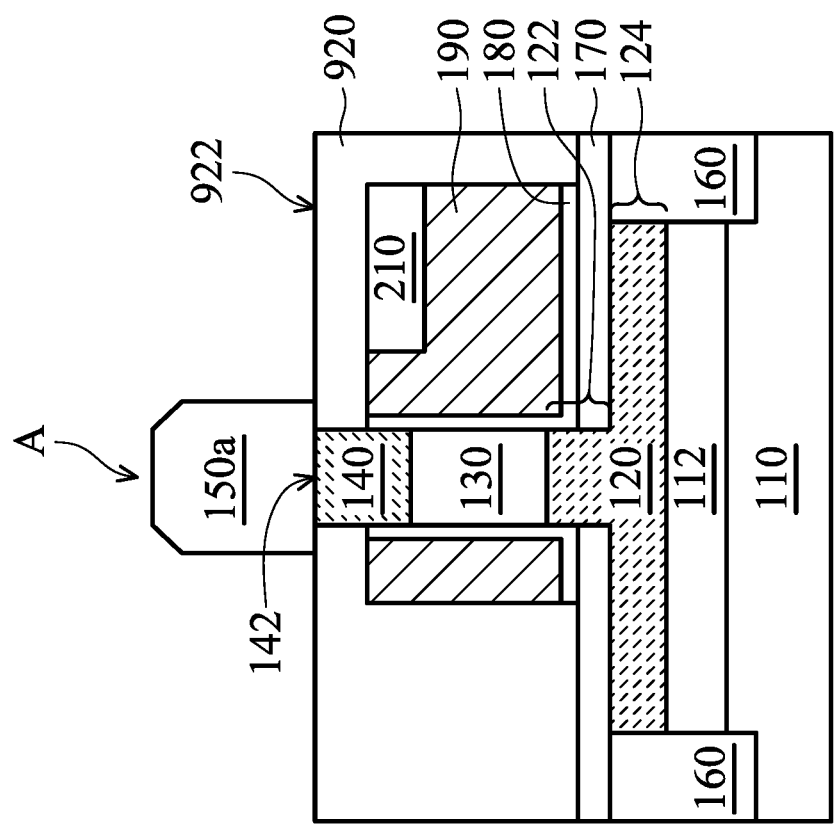

As shown in FIG. 9G, an epitaxy process is performed to form a heavily p-doped layer 150a over the top surface 142 of the n-doped layer 140, in accordance with some embodiments. A portion of the heavily p-doped layer 150a is over the top surface 922 adjacent to the top surface 142, in accordance with some embodiments. The upper portion 122 of the heavily n-doped layer 120, the p-doped layer 130, and the n-doped layer 140, and the heavily p-doped layer 150a together form a pillar structure A, in accordance with some embodiments. The heavily p-doped layer 150a is wider than the n-doped layer 140, in accordance with some embodiments. Therefore, a contact structure formed subsequently may be easily to be connected to the heavily p-doped layer 150a.

Figure 9H:
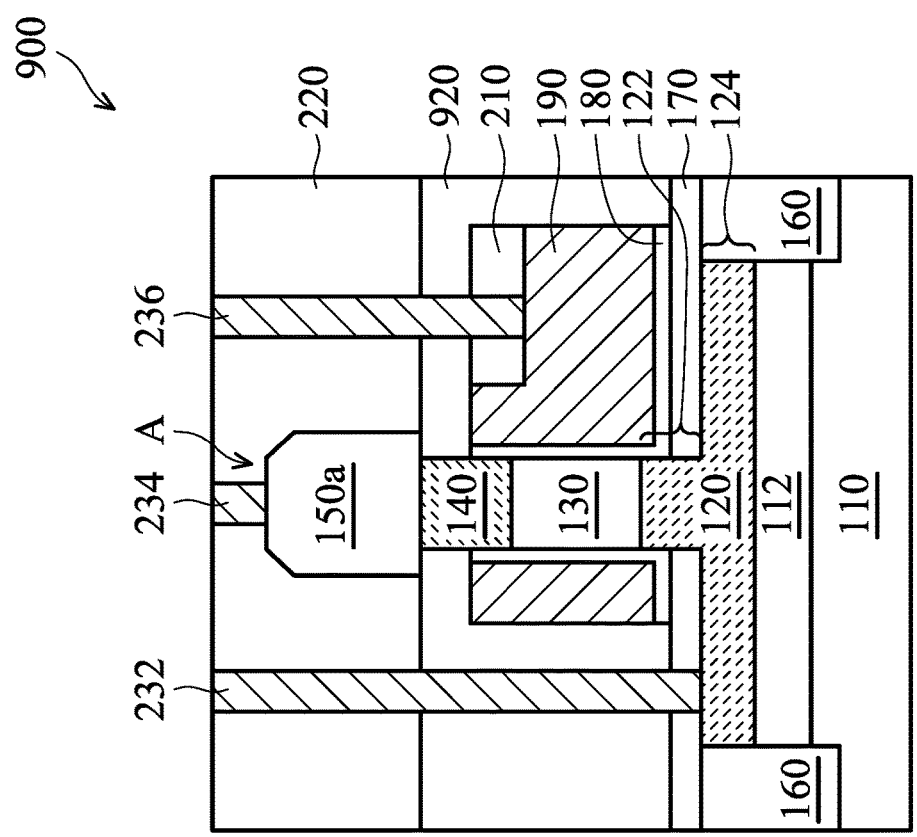

As shown in FIG. 9H, the steps of FIGS. 1M-1P are performed to form a dielectric layer 220 and contact structures 232, 234, and 236, in accordance with some embodiments. The dielectric layer 220 is formed over the dielectric layer 920 to cover the heavily p-doped layer 150a, in accordance with some embodiments. The contact structure 232 passes through the dielectric layers 170, 920, and 220 to be electrically connected to the heavily n-doped layer 120, in accordance with some embodiments.

The contact structure 234 passes through the dielectric layer 220 to be electrically connected to the heavily p-doped layer 150a, in accordance with some embodiments. The contact structure 236 passes through the dielectric layers 210, 920, and 220 to be electrically connected to the gate electrode 190, in accordance with some embodiments.

Figure 10:
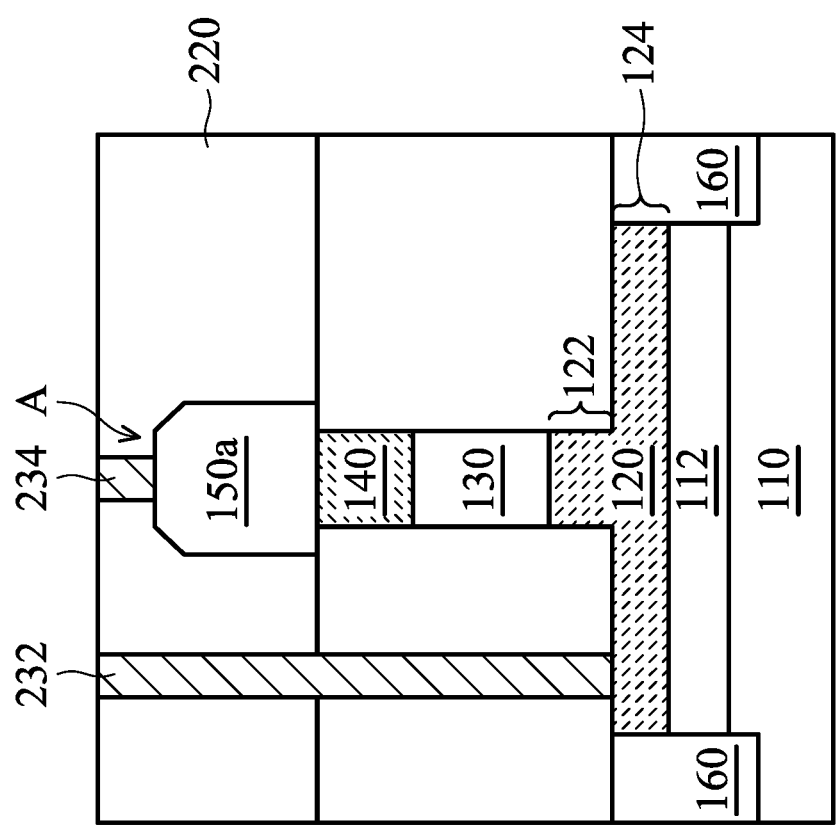
FIG. 10 is a variation of the semiconductor device structure of FIG. 9H, in accordance with some embodiments.

In some other embodiments, as shown in FIG. 10, the dielectric layers 170 and 210, the gate dielectric layer 180, the gate electrode 190, and the contact structure 236 are not formed. The pillar structure A includes a Shockley diode, in accordance with some embodiments.

Figure 11:
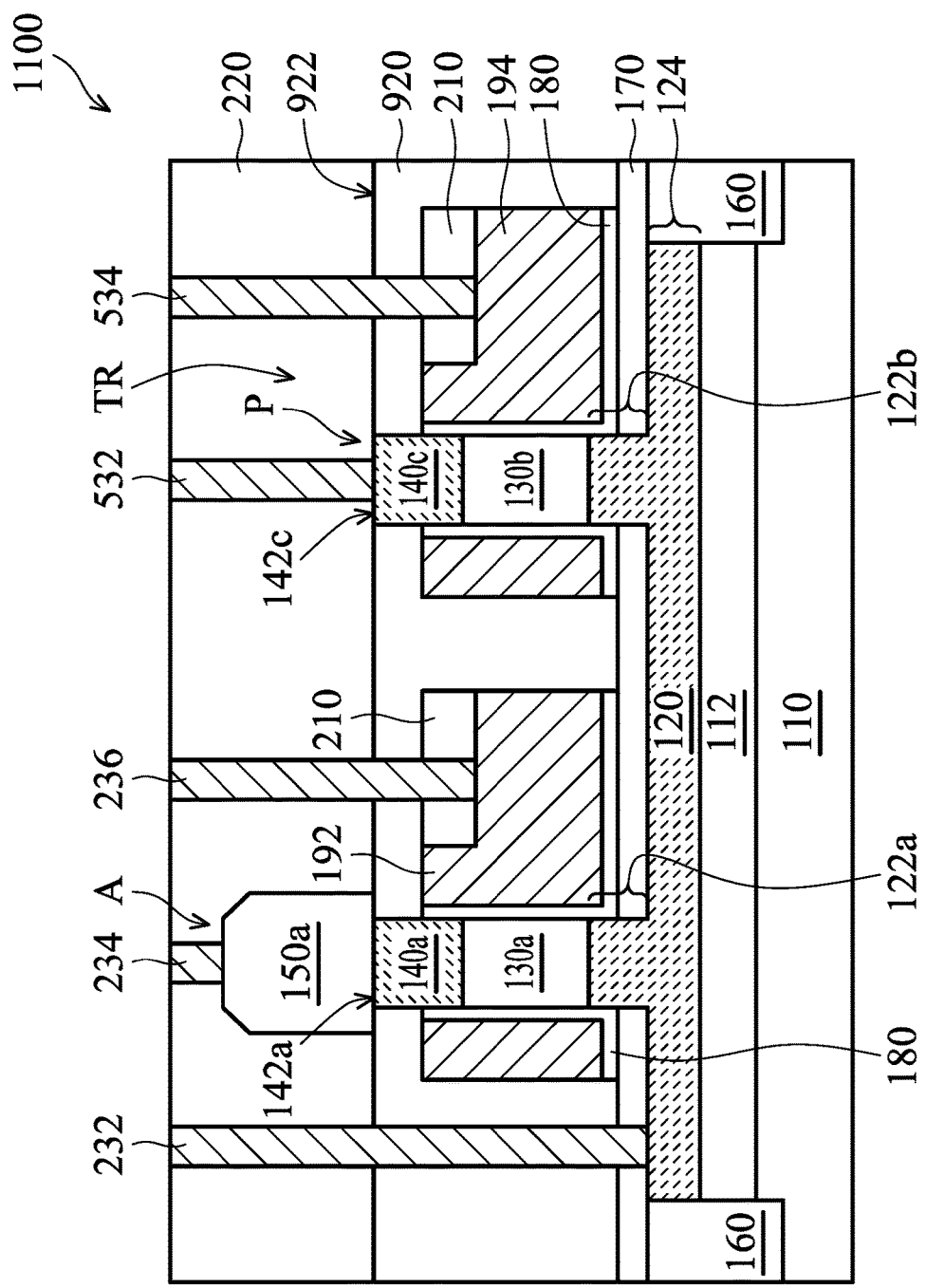
FIG. 11 is a variation of the semiconductor device structure of FIG. 5N, in accordance with some embodiments.

FIG. 11 is a variation of the semiconductor device structure 500 of FIG. 5N, in accordance with some embodiments. As shown in FIG. 11, the semiconductor device structure 1100 is similar to the semiconductor device structure 500 of FIG. 5N, except that the semiconductor device structure 1100 has a heavily p-doped layer 150a and a dielectric layer 920 of FIG. 9H, in accordance with some embodiments.

The dielectric layer 920 is formed over the dielectric layers 170 and 210, the gate electrodes 192 and 194, and the gate dielectric layer 180, in accordance with some embodiments. The top surface 922 of the dielectric layer 920 is aligned with the top surfaces 142a and 142c of the n-doped layer 140a and the heavily n-doped layer 140c, in accordance with some embodiments.

The heavily p-doped layer 150a is formed over the top surfaces 142a, in accordance with some embodiments. The heavily p-doped layer 150a is further formed over the top surface 922 adjacent to the top surface 142a, in accordance with some embodiments. The heavily p-doped layer 150a is wider than the n-doped layer 140a, in accordance with some embodiments. The dielectric layer 220 is formed over the dielectric layer 920, in accordance with some embodiments. The contact structures 232, 236, and 534 further pass through the dielectric layer 920, in accordance with some embodiments.

Figure 12:
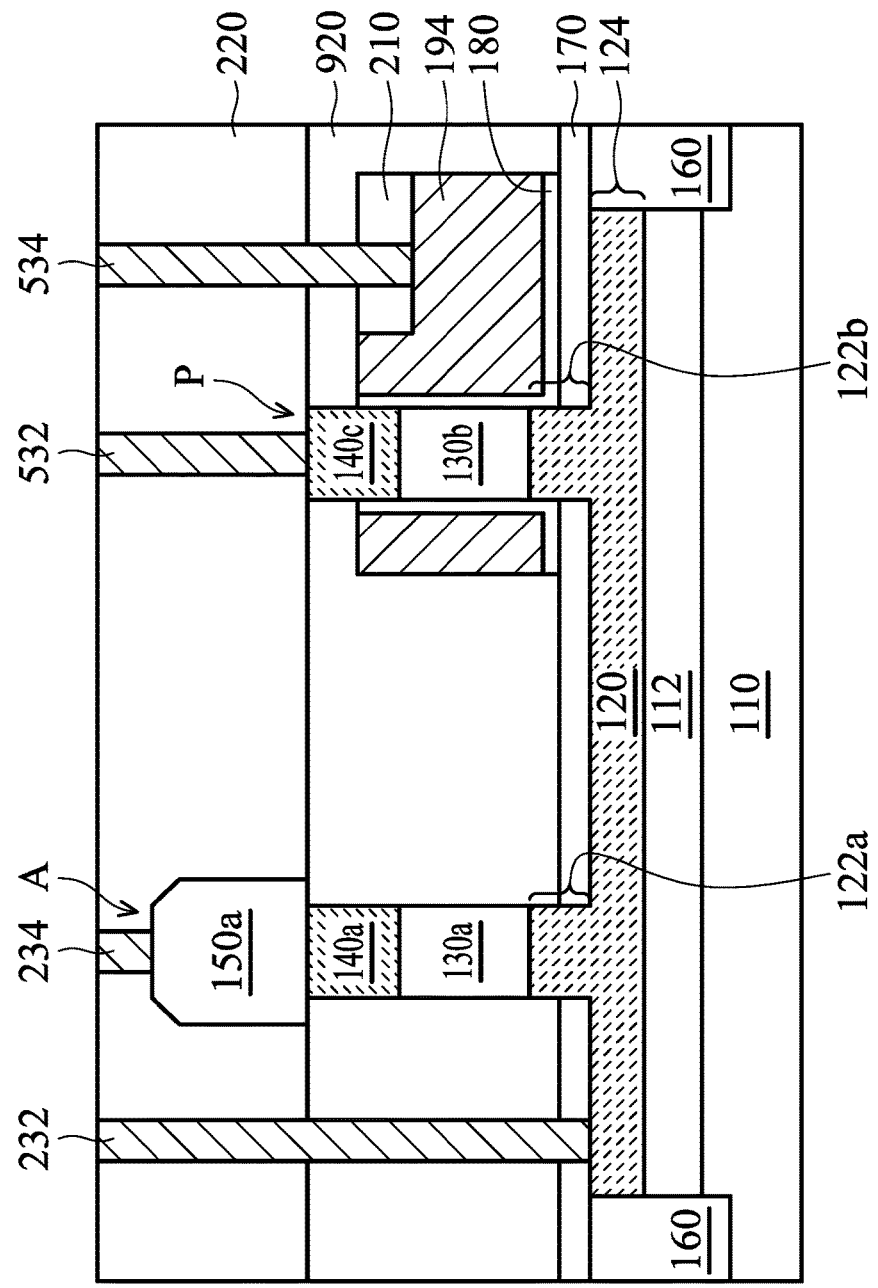
FIG. 12 is a variation of the semiconductor device structure of FIG. 11, in accordance with some embodiments.

In some other embodiments, as shown in FIG. 12, the gate electrode 192, the gate dielectric layer 180 thereunder, the dielectric layer 210 thereon, and the contact structure 236 are not formed. The pillar structure A includes a Shockley diode, in accordance with some embodiments.

Figure 13A:
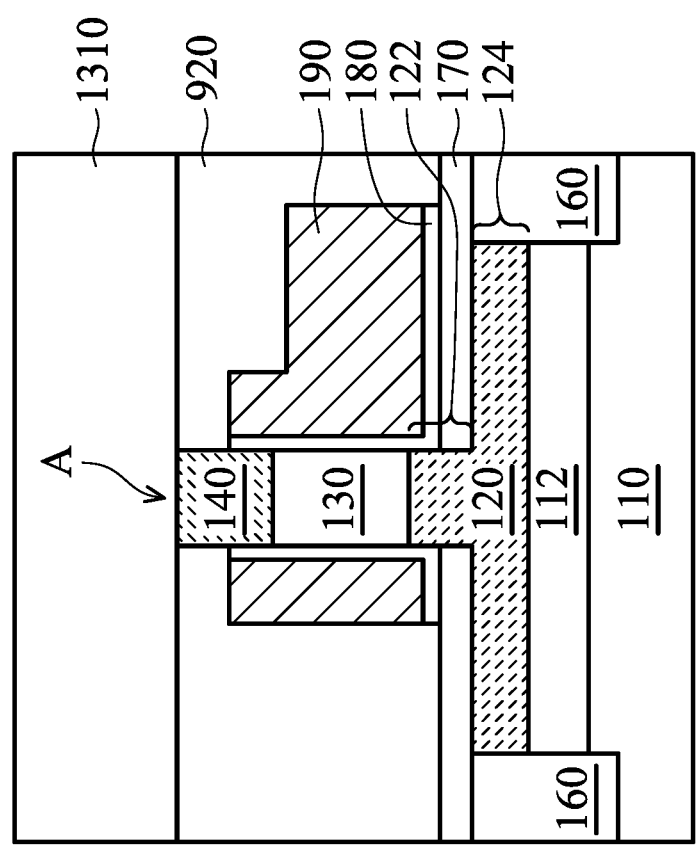
FIGS. 13A-13C are cross-sectional views of various stages of a process for forming a semiconductor device structure, in accordance with some embodiments.
Figure 13B:
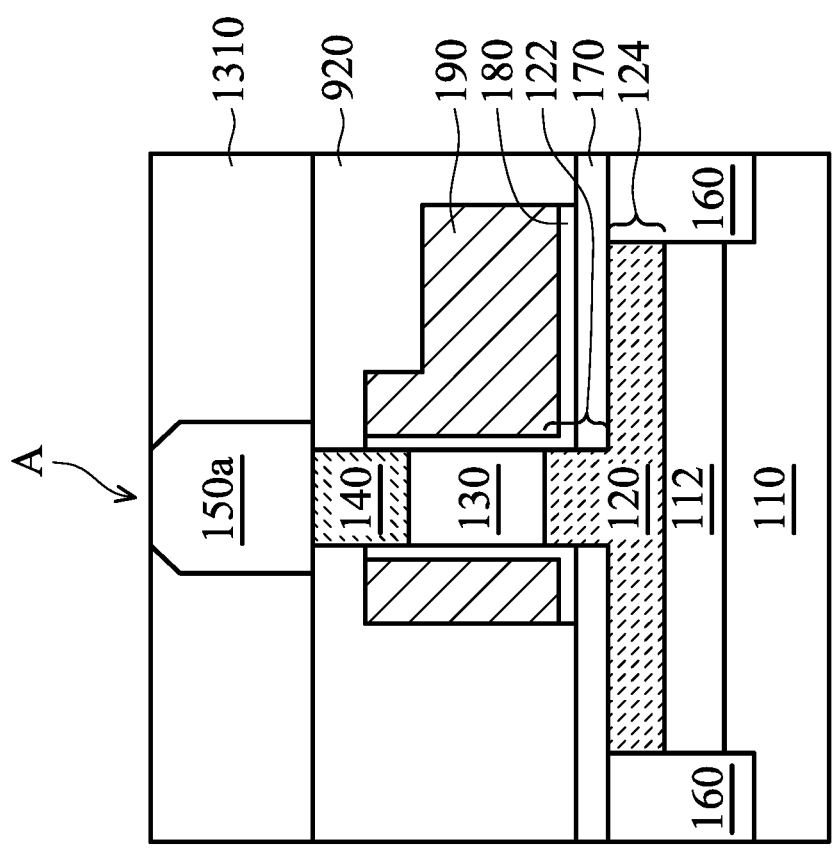
Figure 13C:
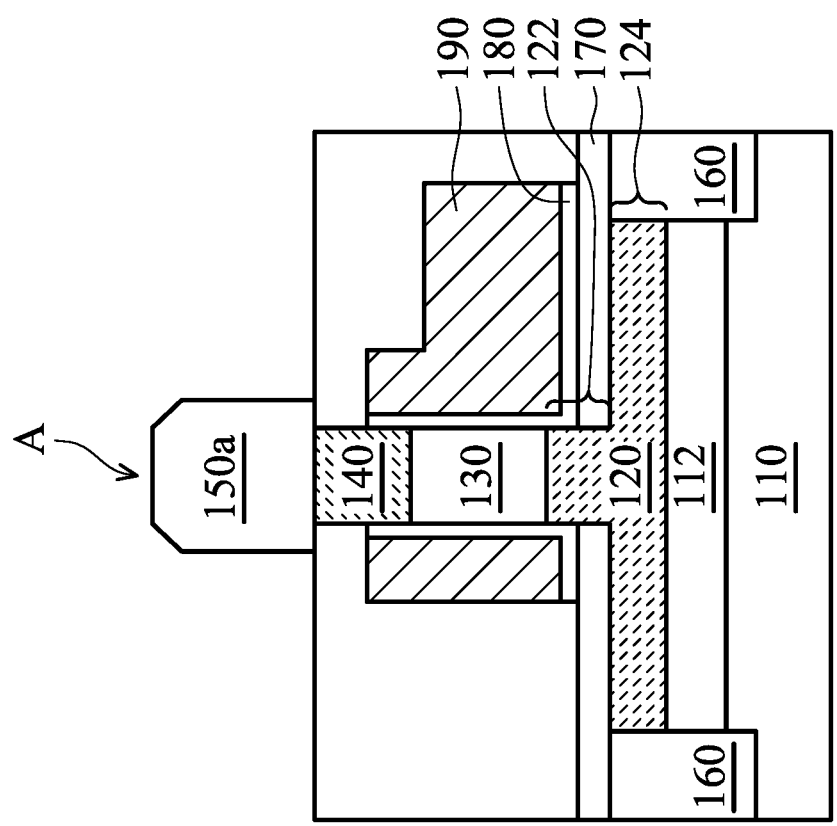

The heavily p-doped layer 150a of FIG. 9G may be formed using another method. One of the methods for forming the heavily p-doped layer 150a is described as follows. FIGS. 13A-13C are cross-sectional views of various stages of a process for forming a semiconductor device structure, in accordance with some embodiments. As shown in FIG. 13A, after the step of FIG. 9F, an amorphous semiconductor layer 1310 is formed over the dielectric layer 920 and the heavily n-doped layer 140, in accordance with some embodiments.

The amorphous semiconductor layer 1310 includes silicon, silicon germanium, or germanium, in accordance with some embodiments. The amorphous semiconductor layer 1310 may be doped with p-type dopants. The amorphous semiconductor layer 1310 is formed using a CVD process or an atomic layer deposition (ALD) process, in accordance with some embodiments.

As shown in FIG. 13B, an annealing process is performed to recrystallizing a portion of the amorphous semiconductor layer 1310 over the heavily n-doped layer 140, in accordance with some embodiments. The heavily n-doped layer 140 is used as a seed layer during the recrystallization process, in accordance with some embodiments.

The annealing temperature of the annealing process ranges from about 500° C. to about 620° C., in accordance with some embodiments. After the annealing process, the portion of the amorphous semiconductor layer 1310 is recrystallized into a heavily p-doped layer 150a with a crystalline structure, in accordance with some embodiments. The recrystallization process is often called as a solid-phase epitaxy process, in accordance with some embodiments.

As shown in FIG. 13C, the amorphous semiconductor layer 1310 except the heavily p-doped layer 150a is removed, in accordance with some embodiments. The removal process includes a wet etching process or a dry etching process, in accordance with some embodiments.

In accordance with some embodiments, semiconductor device structures and methods for forming the same are provided. The methods (for forming the semiconductor device structure) form thyristors or Shockley diodes in a pillar shape (or a nanowire shape). Therefore, the thyristors (or the Shockley diodes) are able to be spaced apart from each other by a small spacing. The methods form a thyristor RAM cell with a thyristor and a transistor both in a pillar shape. Therefore, the thyristor RAM cell has a small size.

In accordance with some embodiments, a semiconductor device structure is provided. The semiconductor device structure includes a substrate having a top surface. The semiconductor device structure includes a first pillar structure over the substrate. The first pillar structure includes a first heavily n-doped layer, a first p-doped layer, an n-doped layer, and a first heavily p-doped layer, which are sequentially stacked together. The first pillar structure extends in a direction away from the substrate.

In accordance with some embodiments, a semiconductor device structure is provided. The semiconductor device structure includes a substrate. The semiconductor device structure includes a nanowire over the substrate. The nanowire includes a first heavily n-doped layer, a p-doped layer, an n-doped layer, and a first heavily p-doped layer, which are sequentially connected in series. The nanowire extends in a direction away from the substrate. The semiconductor device structure includes a gate electrode surrounding the nanowire.

In accordance with some embodiments, a method for forming a semiconductor device structure is provided. The method includes forming a pillar structure over a substrate. The pillar structure includes a first heavily n-doped layer, a first p-doped layer, an n-doped layer, and a first heavily p-doped layer, which are sequentially connected in series. The pillar structure extends in a direction away from the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate having a top surface;
   a first pillar structure over the substrate, wherein the first pillar structure comprises a first heavily n-doped layer, a first p-doped layer, an n-doped layer, and a first heavily p-doped layer, which are sequentially stacked together, and the first pillar structure extends in a direction away from the substrate;
   a gate electrode continuously and horizontally surrounding a portion of the first pillar structure; and
   a gate dielectric layer between the gate electrode and the first pillar structure.

2. The semiconductor device structure as claimed in claim 1, further comprising:
   a second heavily n-doped layer over the substrate, wherein the first pillar structure is over the second heavily n-doped layer, and the second heavily n-doped layer is wider than the first pillar structure.

3. The semiconductor device structure as claimed in claim 1, wherein the gate electrode surrounds the first p-doped layer.

4. The semiconductor device structure as claimed in claim 3, further comprising:
   a second heavily n-doped layer over the substrate, wherein the first heavily n-doped layer of the first pillar structure is connected to the second heavily n-doped layer, and a width of the second heavily n-doped layer is wider than that of the first pillar structure, wherein the gate dielectric layer is between the gate electrode and the first p-doped layer and between the gate electrode and the second heavily n-doped layer.

5. The semiconductor device structure as claimed in claim 1, wherein the first heavily n-doped layer is electrically connected to a transistor.

6. The semiconductor device structure as claimed in claim 5, wherein the first heavily n-doped layer is electrically connected to a second heavily n-doped layer of the transistor.

7. The semiconductor device structure as claimed in claim 6, further comprising:
   a third heavily n-doped layer over the substrate, wherein the first heavily n-doped layer and the second heavily n-doped layer are connected to the third heavily n-doped layer.

8. The semiconductor device structure as claimed in claim 6, wherein the transistor comprises a second pillar structure and a second gate electrode, the second pillar structure comprises the second heavily n-doped layer, a second p-doped layer, and a third heavily n-doped layer, which are sequentially stacked together, and the second gate electrode horizontally surrounds the second p-doped layer.

9. The semiconductor device structure as claimed in claim 8, wherein the first pillar structure and the second pillar structure are spaced apart from each other and in parallel with each other.

10. A semiconductor device structure, comprising:
    a substrate;
    a nanowire over the substrate, wherein the nanowire comprises a first heavily n-doped layer, a p-doped layer, an n-doped layer, and a first heavily p-doped layer, which are sequentially connected in series, wherein the nanowire extends in a direction away from the substrate;
    a gate electrode surrounding the nanowire; and
    a gate dielectric layer between the gate electrode and the nanowire, wherein the gate dielectric layer horizontally and continuously surrounds the nanowire.

11. The semiconductor device structure as claimed in claim 10, wherein a width of the heavily p-doped layer is wider than that of the n-doped layer.

12. The semiconductor device structure as claimed in claim 10, further comprising:
    a second heavily p-doped layer over the substrate, wherein the first heavily p-doped layer is connected to the second heavily p-doped layer, and a width of the second heavily p-doped layer is wider than that of the first heavily p-doped layer.

13. The semiconductor device structure as claimed in claim 10, wherein the first heavily n-doped layer is electrically connected to a transistor.

14. The semiconductor device structure as claimed in claim 13, wherein the first heavily n-doped layer is electrically connected to a second heavily n-doped layer of the transistor.

15. The semiconductor device structure as claimed in claim 10, further comprising a second heavily n-doped layer connected to the first heavily n-doped layer of the nanowire, wherein a width of the second heavily n-doped layer is wider than that of the first pillar structure.

16. A method for forming a semiconductor device structure, comprising:
    forming a pillar structure over a substrate, wherein the pillar structure comprises a first heavily n-doped layer, a first p-doped layer, an n-doped layer, and a first heavily p-doped layer, which are sequentially connected in series, wherein the pillar structure extends in a direction away from the substrate;
    forming a gate dielectric layer continuously and horizontally surrounding a portion of the pillar structure; and
    forming a gate electrode over the gate dielectric layer.

17. The method for forming a semiconductor device structure as claimed in claim 16, wherein the formation of the pillar structure comprises:
    forming the first heavily n-doped layer over the substrate;
    forming the first p-doped layer over the first heavily n-doped layer;
    forming the n-doped layer over the first p-doped layer; and
    forming the first heavily p-doped layer over the n-doped layer, and the method further comprises:

during the formation of the first heavily n-doped layer, forming a second heavily n-doped layer over the substrate;

during the formation of the first p-doped layer, forming a second p-doped layer over the second heavily n-doped layer;

during the formation of the n-doped layer, forming a third heavily n-doped layer over the second p-doped layer; and forming a first gate electrode surrounding the second p-doped layer.

18. The method for forming a semiconductor device structure as claimed in claim 17, further comprising:

during the formation of the first gate electrode, forming a second gate electrode surrounding the first p-doped layer, wherein the first gate electrode and the second gate electrode are spaced apart from each other.

19. The method for forming a semiconductor device structure as claimed in claim 16, wherein the formation of the pillar structure comprises:

forming the first heavily n-doped layer over the substrate;

forming the first p-doped layer over the first heavily n-doped layer;

forming the n-doped layer over the first p-doped layer;

forming a dielectric layer over the substrate and surrounding the first heavily n-doped layer, the first p-doped layer, and the n-doped layer, wherein a top surface of the n-doped layer is exposed by the dielectric layer; and performing an epitaxy process to form the first heavily p-doped layer over the top surface and the dielectric layer adjacent to the top surface.

20. The method for forming a semiconductor device structure as claimed in claim 19, wherein the epitaxy process comprises a solid-phase epitaxy process.

* * * * *